(12) United States Patent
Nakazawa

(10) Patent No.: US 10,917,971 B2
(45) Date of Patent: Feb. 9, 2021

(54) ELECTRONIC COMPONENT, POWER SUPPLY DEVICE, AND METHOD OF MANUFACTURING COIL

(71) Applicant: SONY CORPORATION, Tokyo (JP)

(72) Inventor: Hirofumi Nakazawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/342,767

(22) PCT Filed: Sep. 8, 2017

(86) PCT No.: PCT/JP2017/032502
§ 371 (c)(1),
(2) Date: Apr. 17, 2019

(87) PCT Pub. No.: WO2018/092392
PCT Pub. Date: May 24, 2018

(65) Prior Publication Data
US 2019/0269015 A1    Aug. 29, 2019

(30) Foreign Application Priority Data

Nov. 17, 2016   (JP) .................................. 2016-224259

(51) Int. Cl.
| | |
|---|---|
| H01F 27/24 | (2006.01) |
| H05K 1/18 | (2006.01) |
| H01F 27/28 | (2006.01) |
| H01F 27/29 | (2006.01) |
| H01F 27/32 | (2006.01) |
| H01F 41/02 | (2006.01) |
| H01F 30/10 | (2006.01) |
| H01F 27/255 | (2006.01) |
| H01F 41/12 | (2006.01) |

(52) U.S. Cl.
CPC .............. *H05K 1/181* (2013.01); *H01F 27/24* (2013.01); *H01F 27/255* (2013.01); *H01F 27/2823* (2013.01); *H01F 27/2847* (2013.01); *H01F 27/2852* (2013.01); *H01F 27/292* (2013.01); *H01F 27/32* (2013.01); *H01F 27/324* (2013.01); *H01F 30/10* (2013.01); *H01F 41/02* (2013.01); *H01F 41/12* (2013.01); *H05K 2201/1003* (2013.01)

(58) Field of Classification Search
CPC ..................................................... H05K 1/181
USPC ........................................................ 174/260
See application file for complete search history.

(56) References Cited

U.S. PATENT DOCUMENTS

2014/0328042 A1\* 11/2014 Wu ......................... H01F 27/40
                                                                    361/813

FOREIGN PATENT DOCUMENTS

| JP | 63-180907 U | 11/1988 |
|---|---|---|
| JP | 2008-270347 A | 11/2008 |

(Continued)

OTHER PUBLICATIONS

International Search Report and Written Opinion of PCT Application No. PCT/JP2017/032502, dated Nov. 21, 2017, 10 pages of ISRWO.

*Primary Examiner* — Stanley Tso
(74) *Attorney, Agent, or Firm* — Chip Law Group

(57) ABSTRACT

Provided is an electronic component including a coil portion including a base including a conductive metal, and a terminal portion that is connected to a predetermined circuit board. A front surface of the base is covered, and the terminal portion is exposed.

11 Claims, 22 Drawing Sheets

(56) References Cited

FOREIGN PATENT DOCUMENTS

| JP | 2010-214590 | * | 9/2010 | ............. | B29C 45/14 |
| JP | 2010-214590 A | | 9/2010 | | |
| JP | 2012-164914 A | | 8/2012 | | |
| JP | 2013-089787 | * | 5/2013 | ............. | H01F 30/00 |
| JP | 2013-089787 A | | 5/2013 | | |

* cited by examiner

ELECTRONIC COMPONENT, POWER SUPPLY DEVICE, AND METHOD OF MANUFACTURING COIL

CROSS REFERENCE TO RELATED APPLICATIONS

This application is a U.S. National Phase of International Patent Application No. PCT/JP2017/032502 filed on Sep. 8, 2017, which claims priority benefit of Japanese Patent Application No. JP 2016-224259 filed in the Japan Patent Office on Nov. 17, 2016. Each of the above-referenced applications is hereby incorporated herein by reference in its entirety.

TECHNICAL FIELD

The present disclosure relates to an electronic component, a power supply device, and a method of manufacturing a coil.

BACKGROUND ART

Hitherto, various proposals have been made on power supply units that are used in electronic apparatus. For example, PTL 1 below describes a transformer that is used in a power supply unit.

CITATION LIST

Patent Literature

[PTL 1]
Japanese Patent Laid-open No. 2008-270347

SUMMARY

Technical Problem

In such a field, it is demanded that a loss in a power supply unit be reduced, for example, so that high efficiency can be achieved.

The present disclosure therefore has an object to provide an electronic component, a power supply device, and a method of manufacturing a coil that achieve high efficiency.

Solution to Problem

In order to solve the problem described above, the present disclosure is, for example, an electronic component including a coil portion including a base including a conductive metal, and a terminal portion that is connected to a predetermined circuit board, in which a front surface of the base is covered, and the terminal portion is exposed.

The present disclosure may be a power supply device including the electronic component described above.

Further, the present disclosure is a method of manufacturing a coil including, while holding, by a holding member, a predetermined part of a base including a conductive metal plate, forming at least a protrusion portion with resin on a part of the base that is different from the predetermined part held, and molding, after the protrusion portion is formed, at least the predetermined part with the resin while causing the protrusion portion to be in abutment against a mold.

Advantageous Effects of Invention

According to at least one embodiment of the present disclosure, a loss in the power supply unit can be reduced, so that high efficiency can be achieved. Note that, the effects described here are not necessarily limited, and may be any effect described in the present disclosure. Further, the contents of the present disclosure should not be interpreted as being limited by the exemplified effects.

DESCRIPTION OF EMBODIMENTS

Figure 1:
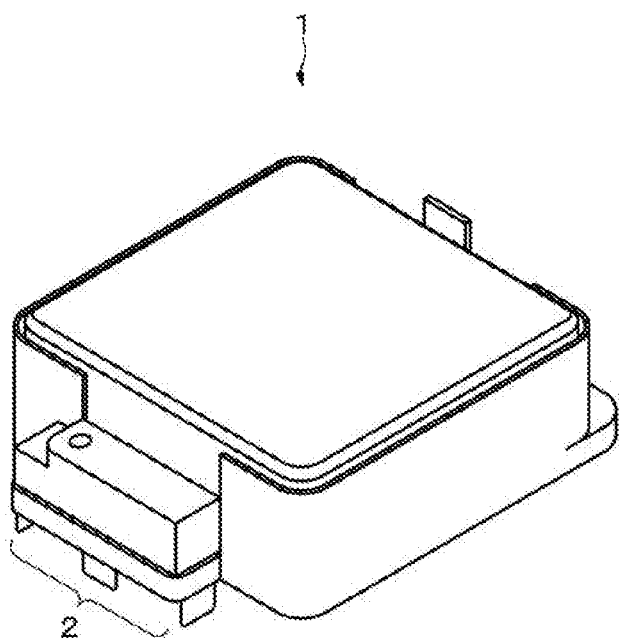
FIG. 1 is a perspective view illustrating an appearance example of a transformer according to a first embodiment of the present disclosure.

Now, embodiments and the like of the present disclosure are described with reference to the drawings. Note that, the description is made on the following items in order.

<1. First Embodiment>
<2. Second Embodiment>
<3. Modified Example>
<4. Application Example>

The embodiments and the like described blow are preferred specific examples of the present disclosure, and the contents of the present disclosure are not limited to these embodiments and the like.

Further, in the following description, expressions that define directions such as up, down, left, and right with, for example, directions in the figures being references are sometimes used. The expressions, however, are intended to facilitate understanding of the present disclosure, and the contents of the present disclosure are not limited to the directions in question. Further, to facilitate understanding of the present disclosure, the direction of each member is appropriately changed in the figures or the size of each member is appropriately changed in the figures in some cases.

General Transformer

In the embodiments of the present disclosure, description is made by taking an insulated transformer (in which the primary side and the secondary side are insulated from each other in accordance with various safety standard requirements) as an example of an electronic component. Prior to the description of the embodiments of the present disclosure, a general transformer is described. For example, in a general winding transformer, a bobbin around which electric wires are wound has primary winding space in which a triple insulated litz wire is wound as primary winding, and secondary winding space in which an electric wire that is a bundle of thin urethane copper wires, which are called "litz wire," is wound as secondary winding. Necessary voltage conversion is performed on the basis of the turn ratio of the primary and secondary winding.

As a copper wire for the secondary winding through which a current larger than the one that flows through the primary winding flows, a copper wire that has a larger conductor area and a lower resistance value than the primary winding has is generally used in order to reduce heat generation (loss). Further, in order to achieve high efficiency, it is necessary that a conductor have a large conductor area such that its resistance value is low in terms of a reduction in loss. As the diameter of the copper wire (electric wire diameter) is increased, however, the winding space itself is naturally increased, and the winding occupancy is reduced due to an increase in electric wire diameter, leading to large wasted space. This is one of major factors that prevent miniaturization of the transformer.

Meanwhile, in order to reduce winding space, there has been proposed a transformer called "substrate-type planar transformer." In the substrate-type planar transformer, a secondary-side coil portion includes a planar substrate on which a predetermined pattern is printed, for example. While the substrate-type planar transformer achieves miniaturization of the entire transformer, such a transformer has a problem that the cost of the planar substrate is high and hence the entire component is expensive. In particular, to provide a planar substrate having a conductor area substantially equivalent to the conductor area of a secondary-side coil (for example, litz wire) that is wound in secondary-side winding space, it is necessary to provide planar substrates in a plurality of layers, and hence such a configuration is more disadvantageous in terms of cost.

Further, in order to achieve high electric power conversion efficiency, it is necessary to reduce losses that are roughly divided into two: an iron loss of a core made of, for example, ferrite and a copper loss of a coil portion. It has been known that the loss of the core is reduced to some extent by reducing the volume of the core. As described above, however, the winding transformer includes the copper wire having a large electric wire diameter to reduce the loss in the coil portion, and thus has large winding space. In order to secure this winding space, it is necessary to increase the length of the magnetic leg of the core, with the result that a loss due to an increase in volume of the core cannot be reduced. This results in a difficulty in sufficiently reducing both the losses.

Further, in the winding transformer, the primary winding and the secondary winding are wound in the winding space of the bobbin under a state where the primary winding and the secondary winding are overlapped with each other as layers (adjacent to each other). This causes intrinsic deflection in which magnetic fluxes of currents affect each other to function as a kind of a resistor that prevents the current flow, with the result that the loss in the coil portion is increased. As the number of winding layers is increased, the effect of the intrinsic deflection is increased to increase the loss.

In addition, in the substrate-type planar transformer, a secondary terminal pin is passed through the planar substrate, which is the secondary-side coil, and the passing portion is joined with solder so that the planar substrate and a circuit board are electrically connected to each other. However, performing solder joining many times is a factor that increases a contact (joining) resistance value to increase the loss, that is, is a factor that prevents high efficiency.

The embodiments of the present disclosure that have been made in view of the characteristics of the general transformer described above are described in detail.

1. First Embodiment

Configuration Example of Transformer

A configuration example of a transformer (transformer 1) according to a first embodiment of the present disclosure is described. FIG. 1 is a perspective view illustrating an appearance example of the transformer 1, and FIG. 2 is an exploded perspective view of the transformer 1.

As illustrated in FIG. 1, the transformer 1 has a box shape as a whole. The transformer 1 includes a terminal portion 2 protruded downward. With solder, the terminal portion 2 is connected to a predetermined circuit board, which is not illustrated. The soldering process may be a well-known process such as so-called flow soldering or may be performed by human hands. Any process is applicable to the soldering process.

Figure 2:
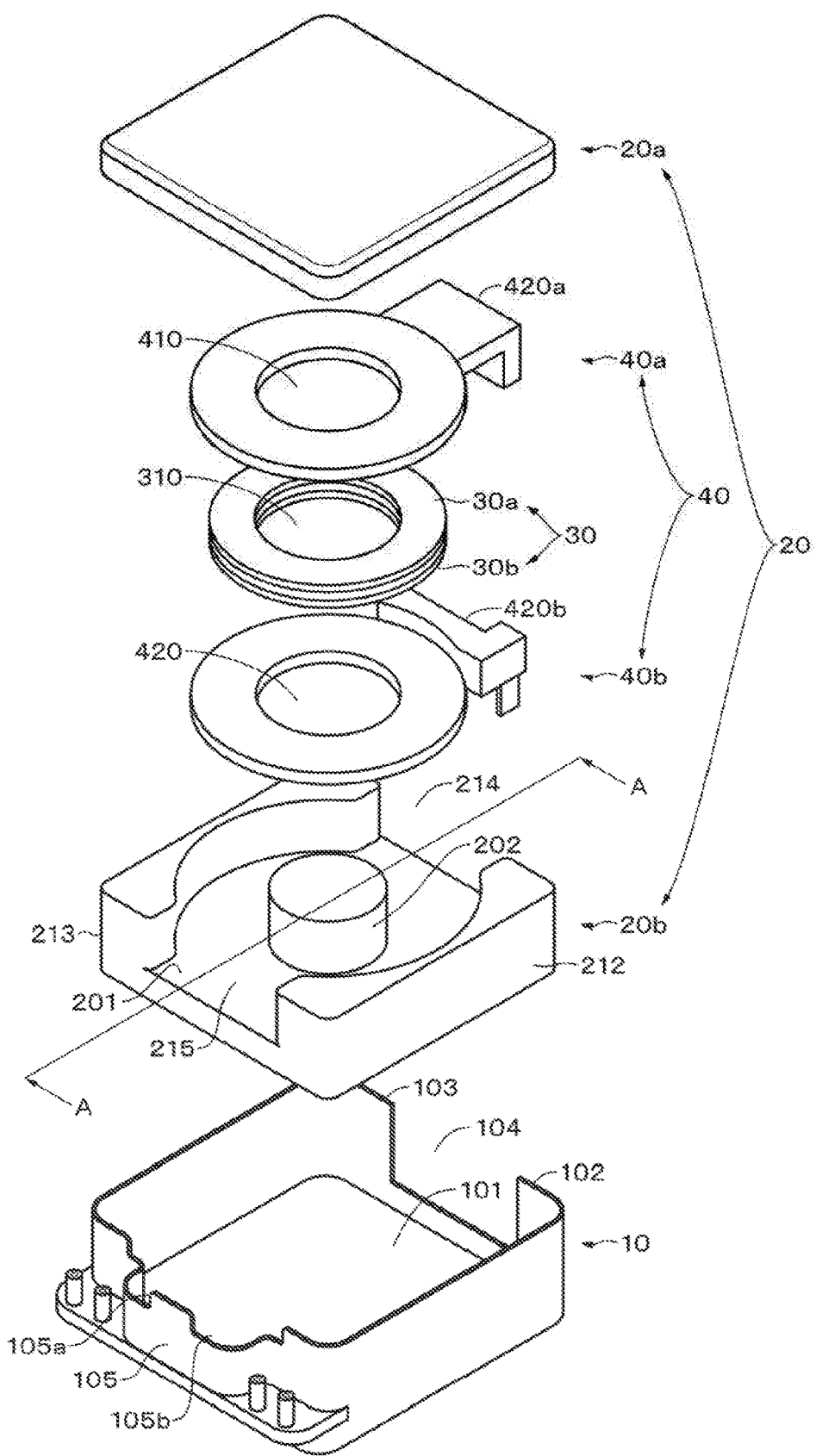
FIG. 2 is an exploded perspective view illustrating a configuration example of the transformer according to the first embodiment of the present disclosure.

As illustrated in FIG. 2, the transformer 1 includes a cover portion 10, a core 20, a primary-side coil 30, and a secondary-side coil 40. The core 20 is divided into an upper part and a lower part, for example, and includes a first core 20a on the upper side and a second core 20b on the lower side. The secondary-side coil 40 includes, for example, two secondary-side coils 40a and 40b.

The cover portion 10 is a cover for insulating the core. The cover portion 10 includes a rectangular bottom wall 101, and three peripheral walls 102, 103, and 105 vertically arranged on part of the periphery of the bottom wall 101. In the peripheral wall 105, upper-part grooves 105a and 105b for pulling out the primary-side coil 30 are formed. In the present example, the peripheral walls 102, 103, and 105 are continuously formed, but the peripheral walls may be independent of each other. An opening 104 is formed between the peripheral wall 102 and the peripheral wall 103. The cover portion 10 has a size enough to house the core 20 on the inner side of each of the peripheral walls 102, 103, and 105.

The core 20a having a lid shape is placed on the core 20b. The core 20b includes a rectangular bottom wall 201, and around the center of the bottom wall 201, a cylindrical protrusion portion 202 is formed. Further, two peripheral walls 212 and 213 are vertically arranged on part of the periphery of the bottom wall 201, and openings 214 and 215 are formed between the peripheral walls 212 and 213. The opening 214 is formed in a part substantially corresponding to the opening 104 of the cover portion 10.

Materials of the core 20 can include a magnetic body such as ferrite. Depending on the usage of the transformer 1, the material of the core 20 can be changed from ferrite to a silicon-containing material such as a highlight material, an orient material, or an amorphous material. As the material of the core 20, permalloy can also be used, for example. The shape of the core 20 is not limited to the shape described above, and can be any shape. The core 20 can be an E-shaped core, for example.

The primary-side coil 30 includes, for example, an insulation coating wire such as a litz wire or a stranded wire wound a predetermined number of times. The primary-side coil 30 is, for example, an insulation coating wire including three layers formed by thermal fusion. The end portions (winding start and winding end) of the primary-side coil 30 are exposed to be connected to appropriate parts. The primary-side coil 30 of the present embodiment includes two layers (primary-side coils 30a and 30b) formed with the use of two coils wound eight times, for example. Under a state where the two layers, namely, the primary-side coils 30a and 30b are stacked, a substantially circular opening portion 310 is formed near their centers.

The secondary-side coil 40 includes two secondary-side coils 40a and 40b. The primary-side coil 30 is disposed between the secondary-side coils 40a and 40b. The secondary-side coils 40a and 40b each practically include a conductive metal plate partly molded with resin, and a part (terminal portion) where the part of the metal plate in question is exposed. At least part of the terminal portion is soldered to the circuit board, and the transformer 1 is electrically connected to the circuit board in question.

Figure 3A:
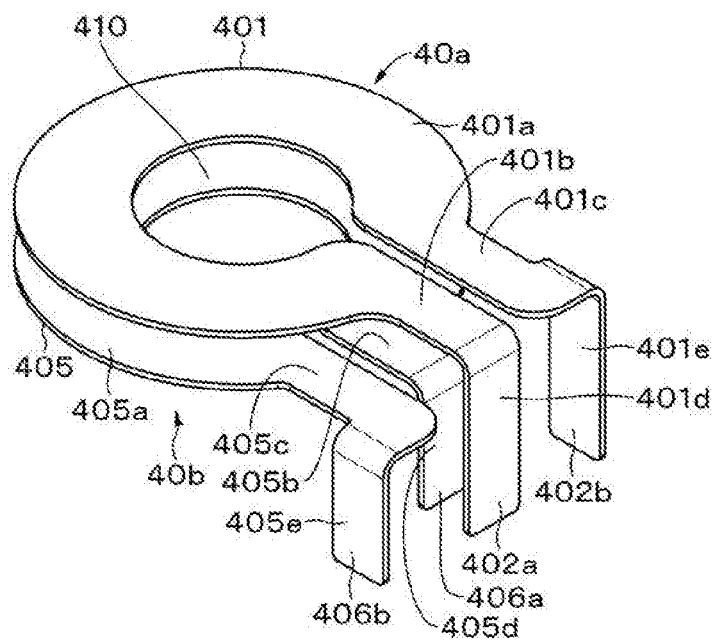
FIG. 3A and FIG. 3B are perspective views illustrating an appearance example of a secondary-side coil according to the first embodiment of the present disclosure.
Figure 3B:
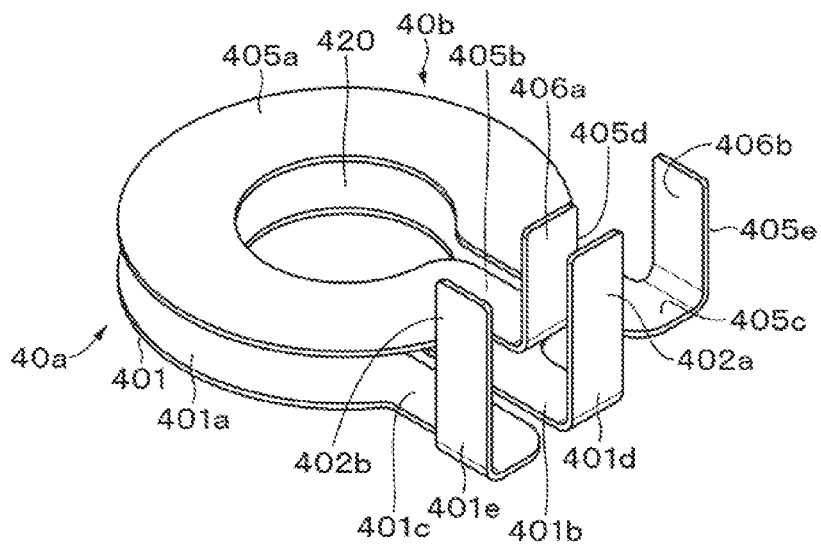

FIG. 3A and FIG. 3B are views illustrating shape examples of the secondary-side coils 40a and 40b before the molding with the resin. FIG. 3B is a view in which the secondary-side coils 40a and 40b illustrated in FIG. 3A are upside down.

The secondary-side coil 40a includes a base 401 including a conductive metal plate such as tough pitch copper. The base 401 includes, for example, a C-shaped base portion 401a, extension portions 401b and 401c that are tips of the base portion 401a extended slightly outward in the horizontal direction, and leg portions 401d and 401e formed by the tips of the extension portions 401b and 401c bent downward. The base portion 401a has a substantially circular opening portion 410 formed at its center. The leg portions 401d and 401e have longitudinal surfaces substantially orthogonal to each other.

The leg portions 401d and 401e have terminal portions 402a and 402b provided at their tips. Specifically, in the present embodiment, the base 401 and the terminal portions 402a and 402b are continuously formed. Although details are described later, the terminal portions 402a and 402b are parts where the front surface of the metal plate is exposed without resin molding, and are parts that are entirely or partly soldered to the circuit board. Note that, the sizes (regions) of the terminal portions 402a and 402b can be appropriately set depending on the size and intended use of the transformer 1, for example. Further, the shapes of the respective leg portions are not limited to the ones having the longitudinal surfaces substantially orthogonal to each other, and can be set to any shape depending on the direction of connection between each terminal portion and the circuit board.

In the secondary-side coil 40a, the base 401, which is a part other than the terminal portions 402a and 402b, is molded with the resin, so that the front surface of the metal plate is not exposed. In addition, there is formed a plate-shaped portion 420a that has a thin plate shape from the extension portions 401b and 401c to the leg portions 401d and 401e, and has an L shape in a cross section (see FIG. 2). The plate-shaped portion 420a is formed with the resin.

The secondary-side coil 40b includes a base 405 including a conductive metal plate such as tough pitch copper. The base 405 includes, for example, a C-shaped base portion 405a, extension portions 405b and 405c that are tips of the base portion 405a extended slightly outward in the horizontal direction, and leg portions 405d and 405e formed by the tips of the extension portions 405b and 405c bent downward. The base portion 405a has a substantially circular opening portion 420 formed at its center. The leg portions 405d and 405e have longitudinal surfaces substantially orthogonal to each other. Further, the longitudinal surface of the leg portion 401d described above and the longitudinal surface of the leg portion 405d are substantially parallel to each other.

The leg portions 405d and 405e have terminal portions 406a and 406b provided at their tips. Specifically, in the present embodiment, the base 405 and the terminal portions 406a and 406b are continuously formed. Although details are described later, the terminal portions 406a and 406b are parts where the front surface of the metal plate is exposed without resin molding, and are parts that are entirely or partly soldered to the circuit board. Note that, the sizes (regions) of the terminal portions 406a and 406b can be appropriately set depending on the size and intended use of the transformer 1, for example. Similar to the secondary-side coil 40a, the shapes of the respective leg portions are not limited to the ones having the longitudinal surfaces substantially orthogonal to each other, and can be set to any shape depending on the direction of connection between each terminal portion and the circuit board. Note that, the front surfaces of the secondary-side coils 40a and 40b may be subjected to a front surface treatment for antioxidation, such as tinning. In this case, the front surfaces of the terminal portion 402a and other portions may be surfaces of the metal plates subjected to the front surface treatment. Specifically, it is enough if the front surfaces of the terminal portion 402a and other portions are conductive surfaces. In the present embodiment, the terminal portions 402a, 402b, 406a, and 406b serve as the terminal portion 2 illustrated in FIG. 1.

In the secondary-side coil 40b, a part other than the terminal portions 406a and 406b is molded with the resin such that the front surface of the metal plate is not exposed. In addition, a plate-shaped support portion 420b having a constant thickness from the extension portions 405b and 405c to the leg portions 405d and 405e is formed (see FIG. 2). The support portion 420b is formed with the resin. With the support portion 420b and the plate-shaped portion 420a engaged with each other, the support portion 420b supports the plate-shaped portion 420a. The plate-shaped portion 420a and the support portion 420b serve as an assembly member, for example.

The thicknesses of the metal plates of the secondary-side coils 40a and 40b are set to from 0.1 to several millimeters (mm), for example. It has been known that high frequency current that is caused to flow through metal is affected by a skin effect. The skin effect is a phenomenon that when alternating current flows through a conductor, the current density is high on the front surface of the conductor and is low at a position away from the front surface. Current having a higher frequency concentrates to the front surface more to increase alternating current resistance of the conductor. In other words, the thicknesses of the coils (thin copper plates) are determined from the frequency of current to be applied. Note that, a skin depth is a depth at which current is 1/e (approximately 0.37) of front surface current, and takes the following value depending on each frequency.

<Skin Depth Depending on Current Frequency>
Frequency: 30 kHz one-side depth: 0.38 mm (both-side depth: 0.76 mm)
Frequency: 65 kHz one-side depth: 0.26 mm (both-side depth: 0.52 mm)
Frequency: 100 kHz one-side depth: 0.21 mm (both-side depth: 0.42 mm)
Frequency: 200 kHz one-side depth: 0.15 mm (both-side depth: 0.30 mm)
Frequency: 300 kHz one-side depth: 0.12 mm (both-side depth: 0.24 mm)

With the metal plate having a thickness of from 0.1 to several millimeters, a power supply circuit having a higher driving frequency can be supported. However, in a case where the power supply circuit has a driving frequency of 300 kHz, for example, even when the metal plate having a thickness of 1 mm is used, the conductor area thereof cannot be effectively utilized. In such a case, the metal plate preferably has a smaller thickness (for example, from 0.1 to 0.2 mm).

Figures 4, 5:
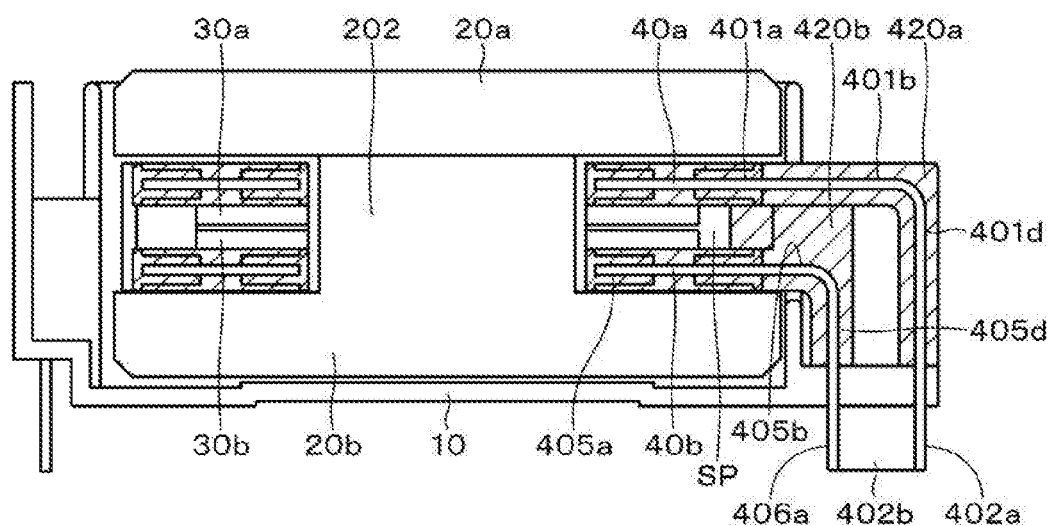
FIG. 4 is a sectional view illustrating a configuration example of the transformer according to the first embodiment of the present disclosure.
FIG. 5 is a diagram illustrating an arrangement example of a primary-side coil and the secondary-side coil according to the first embodiment of the present disclosure.

FIG. 4 is a sectional view illustrating a cross section of the transformer 1 taken along a cutting line A-A of FIG. 2. Note that, in FIG. 4, in order to prevent the figure from being complicated, the illustration of hatching is appropriately omitted, and hatched parts represent parts molded with the resin. With the protrusion portion 202 of the core 20b inserted into the opening portions 420, 310, and 410 sequentially, the primary-side coil 30, the secondary-side coil 40, and the core 20b are integrated. Further, the core 20a is placed on the core 20b, and the core 20 and other members are housed in the cover portion 10. Note that, the respective members of the transformer 1 may be integrated by, for example, bonding an insulating tape, which is not illustrated.

As illustrated in FIG. 4, through the opening 214 of the core 20b and the opening 104 of the cover portion 10, the secondary-side coils 40a and 40b are partly pulled out from the cover portion 10. For example, the terminal portions 402a, 402b, 406a, and 406b that are not molded with the resin are pulled out from the cover portion 10.

With the upper surface of the support portion 420b in abutment against the back surface of the plate-shaped portion 420a, the secondary-side coil 40a is supported by the secondary-side coil 40b. In space SP that is thus formed between the secondary-side coils 40a and 40b, the primary-side coils 30a and 30b are arranged.

Arrangement Example of Primary-Side and Secondary-Side Coils

Next, an arrangement example of the primary-side and secondary-side coils is described. As illustrated in FIG. 5, between the cores 20a and 20b, the secondary-side coil 40a (S(secondary)-2) and the secondary-side coil 40b (S-1) are arranged. Between the secondary-side coils 40a and 40b, the primary-side coil 30a (P(primary)-2) and the primary-side coil 30b (P-1) are arranged in order from the top to the bottom.

Figure 6:
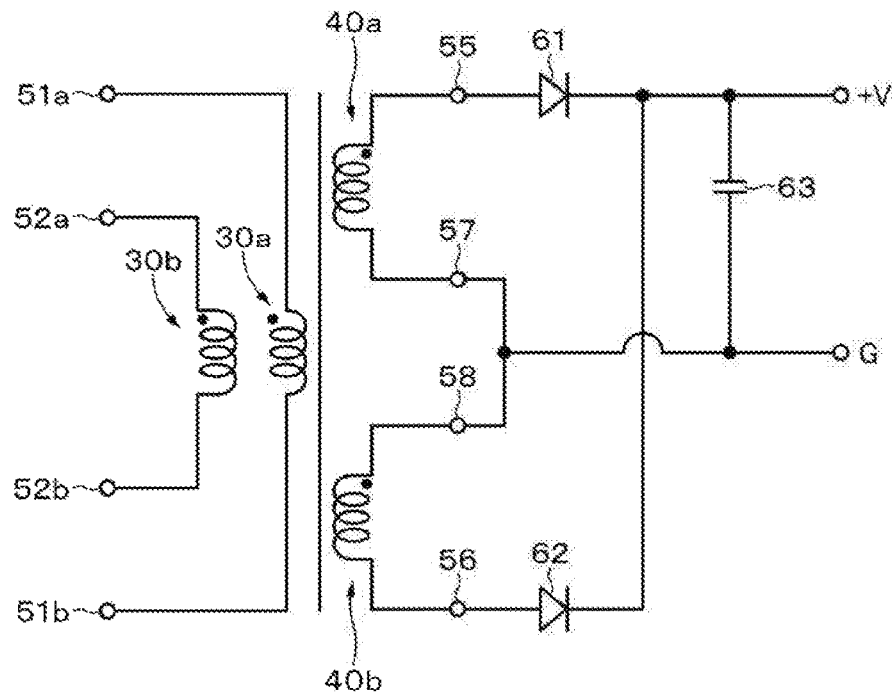
FIG. 6 is a wiring diagram illustrating a connection example of the transformer according to the first embodiment of the present disclosure.

FIG. 6 is a wiring diagram of the transformer 1. Terminals 51a and 51b are, for example, terminals connected to the start end (winding start) and finish end (winding end) of the primary-side coil 30a. Terminals 52a and 52b are, for example, terminals connected to the start end and finish end of the primary-side coil 30b.

Terminals 55 and 56 are terminals corresponding to polarities depending on a control system of the transformer 1, and are terminals corresponding to the terminal portions 402b and 406b described above. Further, terminals 57 and 58 are terminals corresponding to a ground (GND), and are terminals corresponding to the terminal portions 402a and 406a described above. From the terminals 55 and 56, a predetermined voltage +V is output through backflow prevention diodes 61 and 62. A capacitor 63 is connected between an output line and the ground.

In the present embodiment, the connection of the primary-side coils 30a and 30b is changed, so that two outputs of 12 V and 24 V can be supported, for example. In a case where, in FIG. 6, the two primary-side coils 30a and 30b are connected in series, specifically, the terminal 51a and the terminal 52a are connected to each other and the terminal 51a and the terminal 52b serve as the input terminal of the primary-side coil, for example, the turn ratio is 16:1 (when the number of turns of each of the primary-side coils 30a and 30b is eight), and hence a voltage of 12 V can be output. On the other hand, in a case where the terminal 51a and the terminal 52a are connected to each other while the terminal 51b and the terminal 52b are connected to each other, and the primary-side coils 30a and 30b having the respective terminals as their input terminals are connected in parallel, the turn ratio is 8:1, and hence, a voltage of 24 V can be output.

Figure 7:
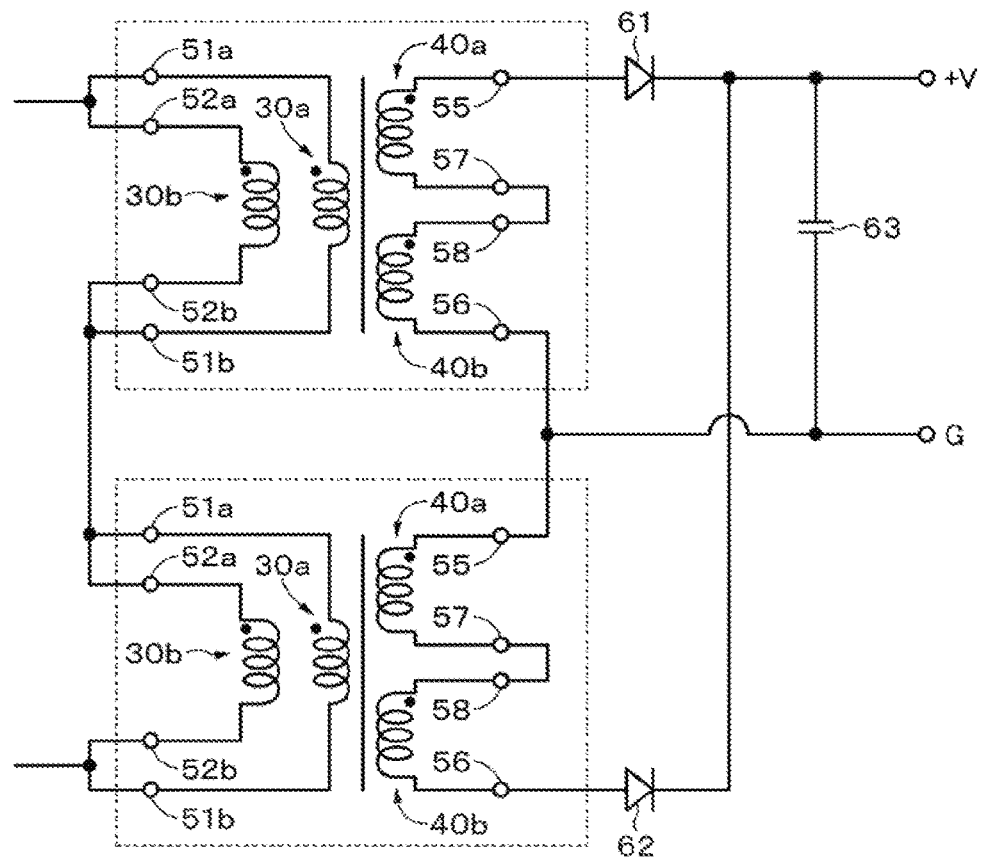
FIG. 7 is a wiring diagram illustrating another connection example of the transformer.

Further, in the present embodiment, for example, as illustrated in FIG. 7, with the use of two transformers having the same specification in which four primary-side coils are connected in parallel and series while each two of four secondary-side coils are connected in series, the turn ratio can be 16:2 (in a case of 24 V). However, the transformer does not necessarily support two outputs and may only support one output. In this case, the primary winding may include one wire (one coil).

The transformer 1 according to the first embodiment of the present disclosure is described above. With the transformer 1 according to the first embodiment, the following effects can be obtained, for example.

No winding is used for the secondary-side coil 40, and hence space for winding is unnecessary. The transformer 1 can thus be miniaturized. Further, it is unnecessary to increase the length of the magnetic leg of the core to secure winding space, with the result that the loss due to an increase in volume of the core can be prevented. Besides, there is no intrinsic deflection, which may occur with winding wires overlapped with each other in an adjacent manner, and hence the loss due to the intrinsic deflection does not occur.

In addition, using no planar substrate provides an advantage in cost. Further, it is unnecessary to connect planar substrates to each other with solder, and hence an increase in loss due to an increase in resistance value of a solder joining part is prevented.

Moreover, with the primary-side coil 30 being a heat-sealed coil, automatic winding can be achieved. With the secondary-side coil 40 including the component that is the thin metal plate molded with the resin, work by skilled winding workers that is indispensable for production of converter transformers using litz wires in the related art is unnecessary, and hence an inexpensive production system that is not affected by production volumes, changes in labor cost, or other factors can be built. Further, stable product quality independent of worker's skill level can be achieved. In addition, with the secondary-side coil 40 divided into two, for example, fully automatic assembly by robot arms or the like can be easily performed, which leads to a further reduction in production cost.

Further, in the transformer 1 according to the embodiment of the present disclosure, the primary-side coil 30 includes the insulation coating wire, and the part other than the terminal portions of the secondary-side coil 40 is molded with the resin. Specifically, the conductor portion other than the solder joint terminal portions of each coil is protected by the electric wire coating or the resin, and hence, for example, surge voltage is hardly transferred through the transformer 1, with the result that the power supply circuit is prevented from being damaged. This means that high surge immunity can be achieved. The surge immunity is one of tests defined by IEC 61000-4-5, for example. The surge immunity in which the resistance of electric circuits or other apparatus is checked by instantaneously generating (applying) abnormally high voltage to the apparatus is generally used as a test for the effects of lightning surge due to lightning. However, even without lightning, under an unstable environment including electric power supply equipment, similar surge voltage sometimes arrives at outlets indoors through electric wires installed outdoors, for example. In this case, consumer apparatus including television devices break down due to the surge voltage in some cases, and a countermeasure therefor is accordingly demanded. With the transformer 1 of the embodiment, the high surge immunity can be achieved, and hence not only surge voltage due to lightning but also surge voltage that may be generated in an environment or area where voltage is unstable can be dealt with.

Further, with the transformer 1 according to the embodiment of the present disclosure, low EMI (Electro Magnetic Interference) can be achieved. In general, in an insulated transformer, high frequency noise is propagated to the secondary side as low impedance due to minute stray capacitance between primary and secondary coils. In a case where a secondary-side coil is not molded with resin, in general, a quite thin insulating film is only provided between a primary coil and a secondary coil insulated from each other, and a separator for physically separating the two coils is not provided. This means that the coils are adjacent to each other in a very close manner. Consequently, stray capacitance in a transformer is increased and noise source voltage electrostatically induced is thus increased, resulting in a deterioration in EMI, for example. A larger noise source voltage is generated with a larger stray capacitance. The noise source voltage is one of factors that deteriorate the EMI, and to deal with this, it is necessary to add a noise suppression component such as a common mode coil. This increases a cost due to an increase in number of components and prevents miniaturization of the transformer. With the transformer 1 according to the embodiment of the present disclosure, the secondary-side coil 40 is molded with the resin, and a moderate distance is incidentally secured between the primary-side coil and the secondary-side coil to reduce the stray capacitance. As a result, for example, the problem of propagation of high frequency noise can be avoided.

Figure 8:
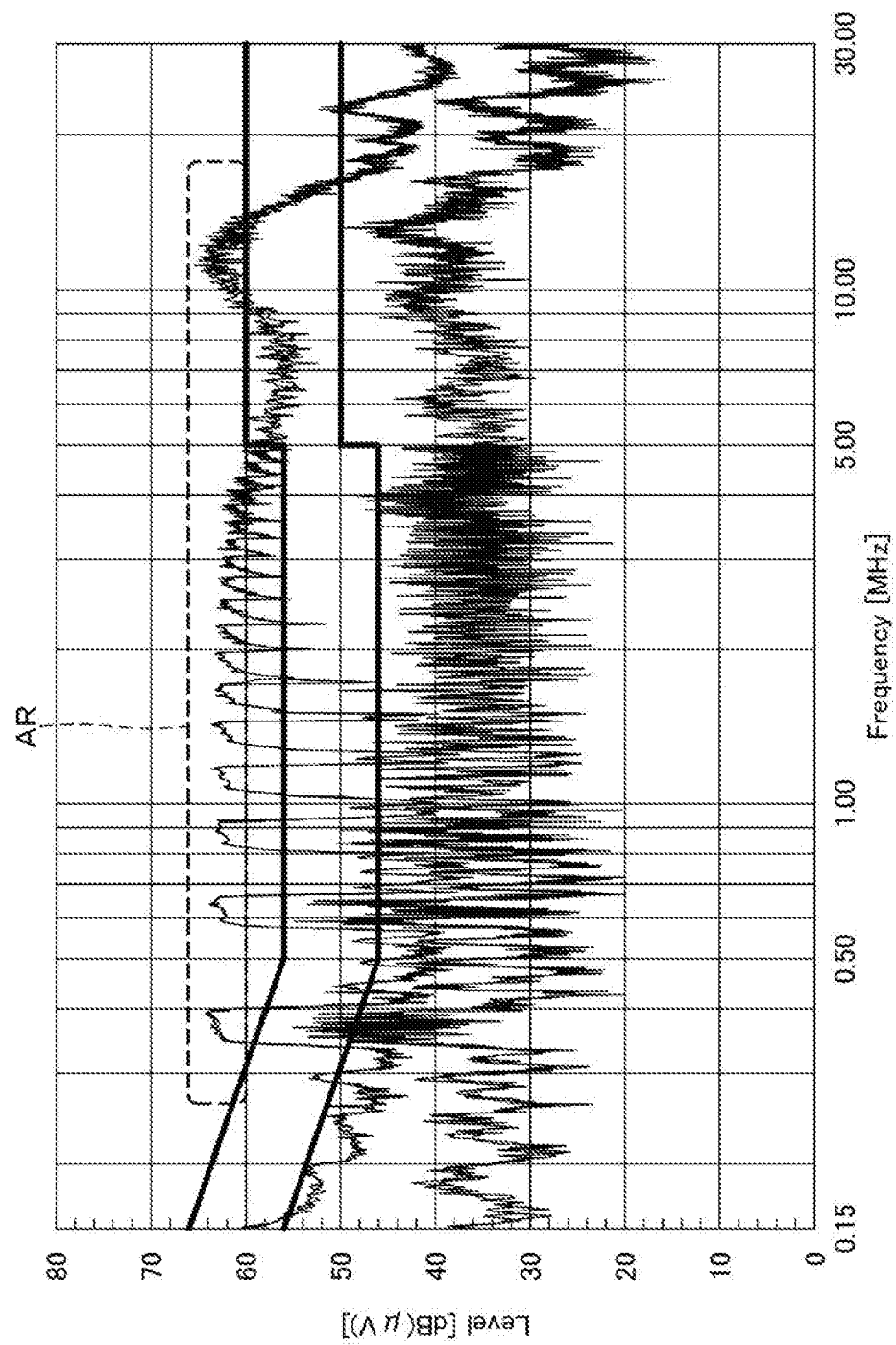
FIG. 8 is a diagram illustrating an example of a feedback noise level.
Figure 9:
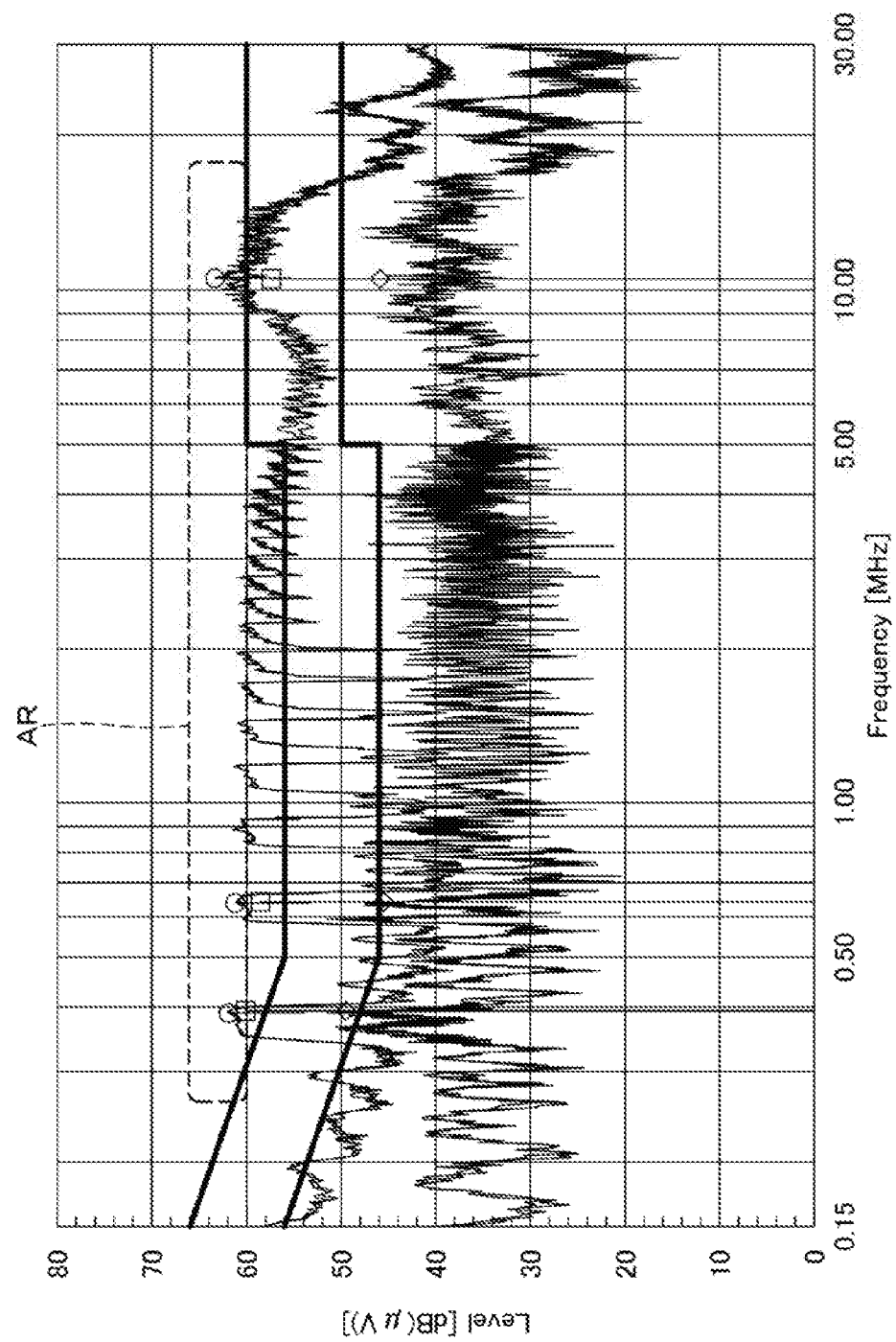
FIG. 9 is a diagram illustrating an example of the feedback noise level.
Figure 10:
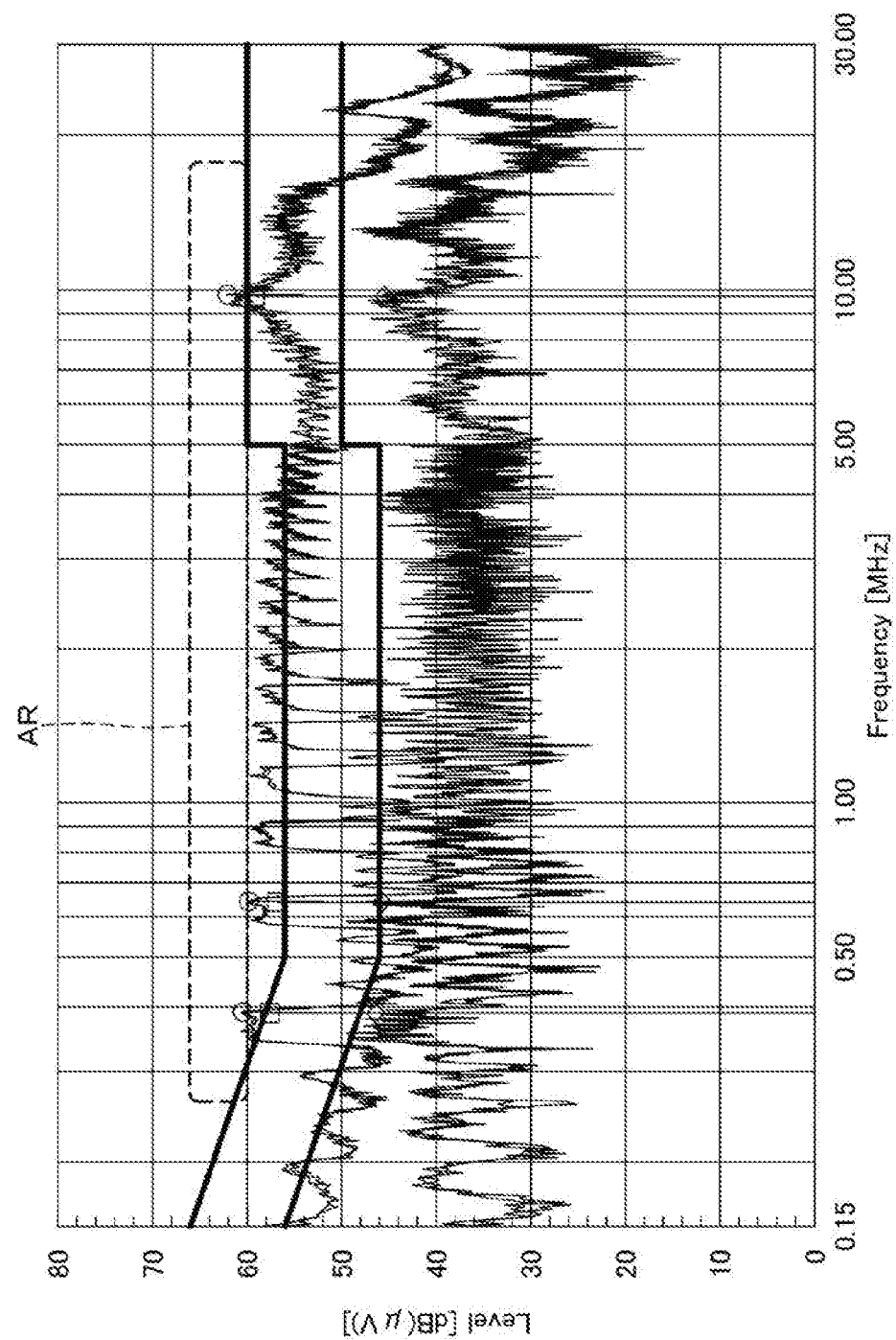
FIG. 10 is a diagram illustrating an example of the feedback noise level.

FIG. 8 to FIG. 10 are graphs illustrating a feedback noise level depending on a frequency. In FIG. 8 to FIG. 10, the horizontal axis represents the frequency while the vertical axis represents the feedback noise level. Further, FIG. 8 is an example in which the secondary-side coil 40 is not molded with the resin, FIG. 9 is an example in which the secondary-side coil 40 has the resin with a thickness of 0.5 mm, and FIG. 10 is an example in which the secondary-side coil 40 has the resin with a thickness of 1.0 mm. Here, the thickness of the resin is a total of a thickness of the resin on the back surface of the base portion 401a of the secondary-side coil 40a, and a thickness of the resin on the front surface of the base portion 405a of the secondary-side coil 40b. When the resin thickness is increased, the stray capacitance can be reduced, but the size of the transformer is increased instead. In order to miniaturize the transformer, the resin is desirably as thin as possible in terms of the insulation structure.

When FIG. 8 to FIG. 10 are compared to each other, with the secondary-side coil 40 molded with the resin, the primary-side coil 30 and the secondary-side coil 40 are away from each other, and hence an increase in stray capacitance can be prevented. Thus, as represented by a part indicated by a dotted line AR of FIG. 8 to FIG. 10, the peak level of feedback noise can be reduced.

Further, with the use of a predetermined material, for example, UL 1446. Class B is easily acquired. In UL 1446. Class B, a material that is used for a transformer is limited, but a temperature (allowable temperature) of heat that is generated when the transformer is used is set to 130° C. Specifically, by acquiring UL 1446. Class B, a transformer can be miniaturized although the transformer generates heat.

Method of Manufacturing Coil

Next, a method of manufacturing a coil according to the embodiment of the present disclosure is described. Here, the secondary-side coil 40 is described as an example. As a molding method of molding the secondary-side coil 40 with the resin, for example, injection molding is given. In injection molding, under a state where the secondary-side coil 40 is housed in a mold, the mold in question is filled with the resin. Note that, the resin may be a so-called thermoplastic resin that is softened to be processable when being heated and is solidified when being cooled, a so-called thermosetting resin that is softened to be processable when being heated and is never softened again even when being heated once it is cured, or another type of resin.

Figure 11A:
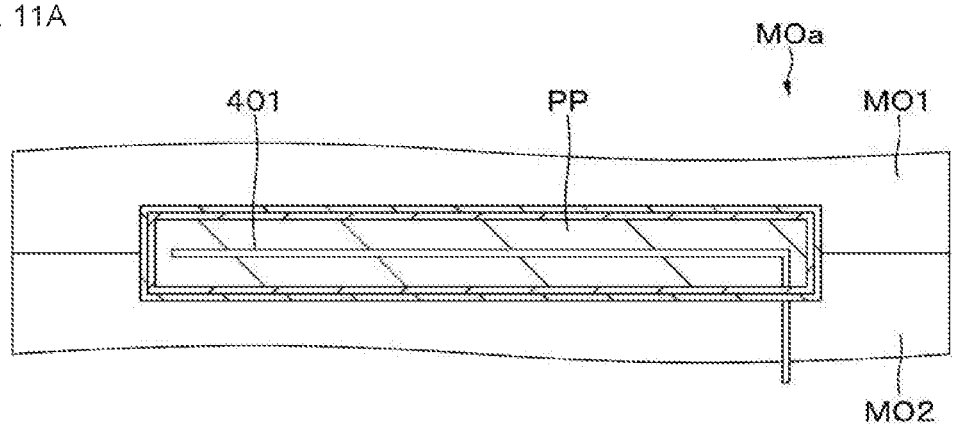
FIG. 11A is a view schematically illustrating the secondary-side coil housed in a mold.

FIG. 11A is a view schematically illustrating a state where, for example, the base 401 of the secondary-side coil 40a is housed in a mold MOa including a male MO1 and a female MO2. Under this state, a resin PP is injected into the cavity of the mold MOa.

Figure 11B:
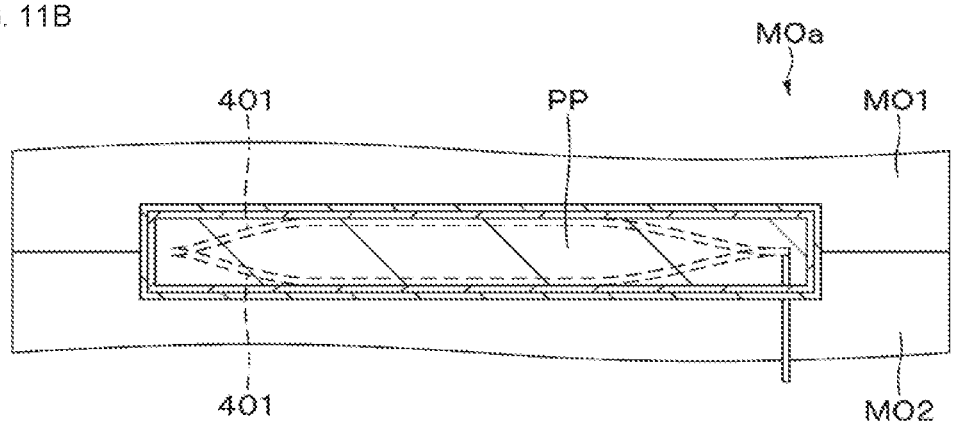
FIG. 11B is a view schematically illustrating the secondary-side coil deformed due to the pressure of resin injection.

Here, in a case where the resin is directly molded on the thin metal plate, it is desired that the center of the thickness of the molded resin and the center position of the secondary-side coil 40a be substantially the same and the resin PP cover the surrounding of the entire portion in question such that the base 401 is not exposed. However, as schematically illustrated in FIG. 11B, for example, as a result of receiving the pressure of injection of the resin PP, the thin base portion 401a warps in the cavity of the mold MOa to be pressed against the inner wall in the cavity. The center of the thickness of the molded resin and the center position of the secondary-side coil 40a are consequently deviated from each other, and the front surface of the base 401 is partly not molded with the resin to be exposed in some cases. The method of manufacturing a coil according to the embodiment of the present disclosure for dealing with such a problem is described.

Figure 12:
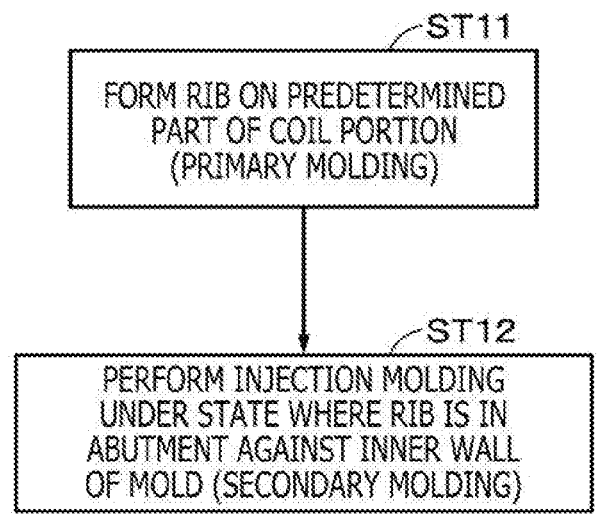
FIG. 12 is a flowchart illustrating the flow of a method of manufacturing a secondary-side coil according to the embodiment of the present disclosure.

FIG. 12 is a flowchart illustrating an example of the method of manufacturing a coil. In the following, a method of manufacturing the secondary-side coil 40b is described. In the method of manufacturing a coil according to the embodiment, the resin is molded twice in primary molding and secondary molding. Specifically, in Step S11 in which the primary molding is performed, a rib is formed on a predetermined part of the secondary-side coil 40b. Then, in Step S12 in which the secondary molding is performed, injection molding is performed under a state where the rib formed through the primary molding is in abutment against the inner wall of the mold, so that the resin is molded on the base 405.

Figure 13:
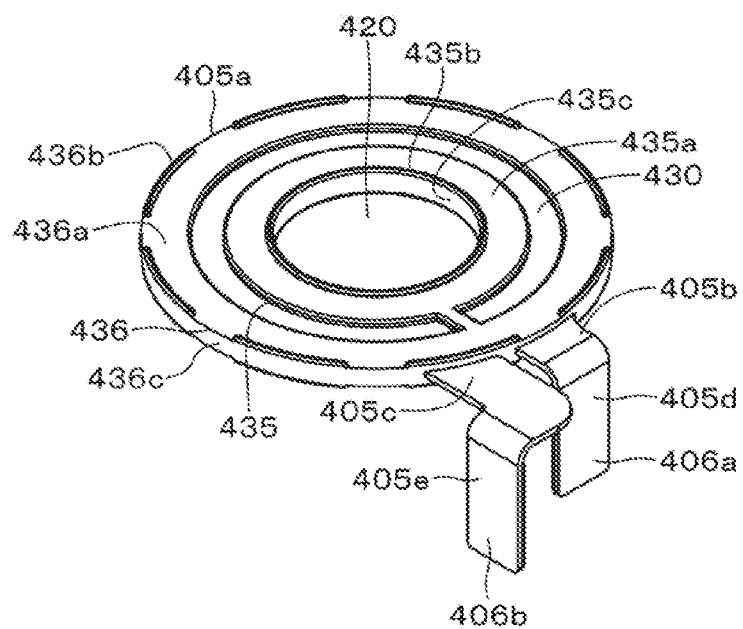
FIG. 13 is a perspective view illustrating the secondary-side coil after primary molding.

FIG. 13 is a perspective view illustrating the secondary-side coil 40b after the primary molding. As illustrated in FIG. 13, the base portion 405a, which is a part of the base 405, has set therein a substantially C-shaped clamp portion 430 concentric to the opening portion 420. Note that, the clamp portion 430 is also set on the back surface of the base portion 405a. Under a state where the clamp portion 430 is sandwiched (sandwiched to be held) by the mold that is an example of a holding member, injection molding (primary molding) is performed. A configuration that is formed through the primary molding is appropriately referred to as "inner frame." Note that, in the following, the inner frame on the front-surface side of the base portion 405a is described, but a similar inner frame is formed on the back-surface side thereof.

Figure 14:
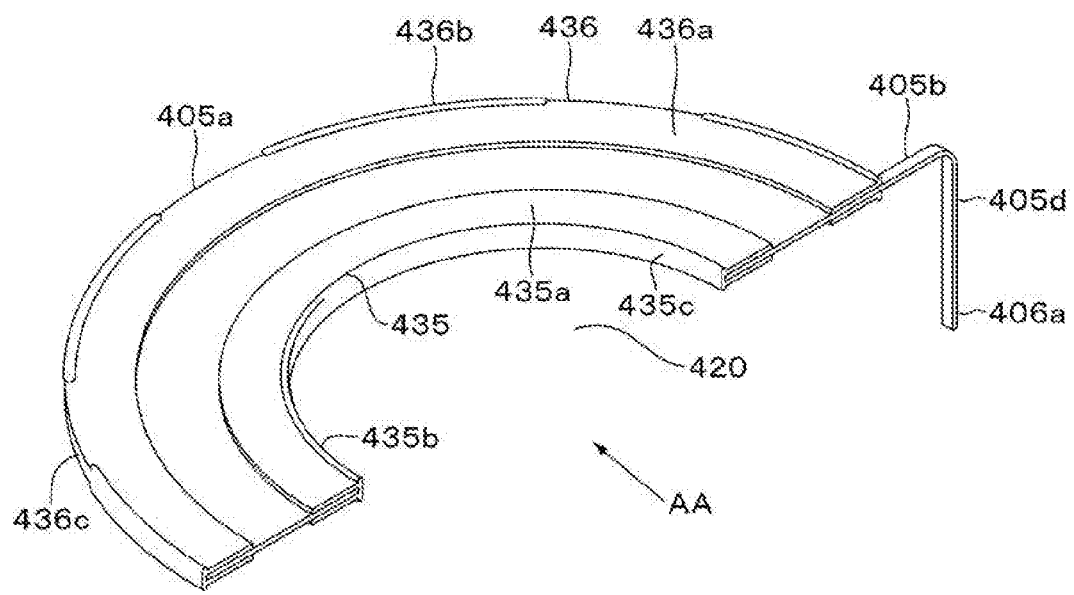
FIG. 14 is a perspective view illustrating the half of the secondary-side coil after the primary molding.
Figure 15:
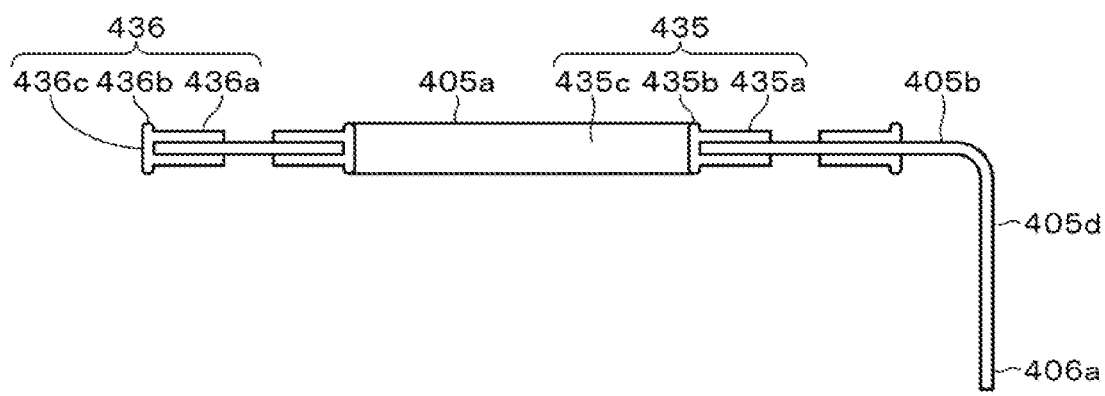
FIG. 15 is a view along an arrow AA of FIG. 14.

FIG. 14 is a perspective view of the half of the secondary-side coil 40b, and FIG. 15 is a view along an arrow AA of FIG. 14. With reference to FIG. 13 to FIG. 15, the inner frame that is formed through the primary molding is described in detail. The inner frame that is formed through the primary molding includes a resin portion 435 and a resin portion 436. At least one of the resin portion 435 and the resin portion 436 serves as a first resin portion. The resin portion 435 includes a ring-shaped resin layer 435a formed between the opening portion 420 and the clamp portion 430 of the base portion 405a, a rib 435b that is a protrusion portion formed on the inner periphery of the resin layer 435a, and a resin layer 435c formed on the inner peripheral surface of the base portion 405a.

Further, the resin portion 436 includes a ring-shaped resin layer 436a formed near the outer periphery of the base portion 405a, a rib 436b that is a protrusion portion formed on the outer periphery of the resin layer 436a, and a resin layer 436c formed on the outer peripheral surface of the base portion 405a. The thicknesses of the resin layers 435a, 435c, 436a, and 436c are substantially the same, and are approximately from 0.2 to 0.5 mm, for example. The rib 436b includes a plurality of (for example, eight) ribs formed at substantially equal intervals.

Figure 16:
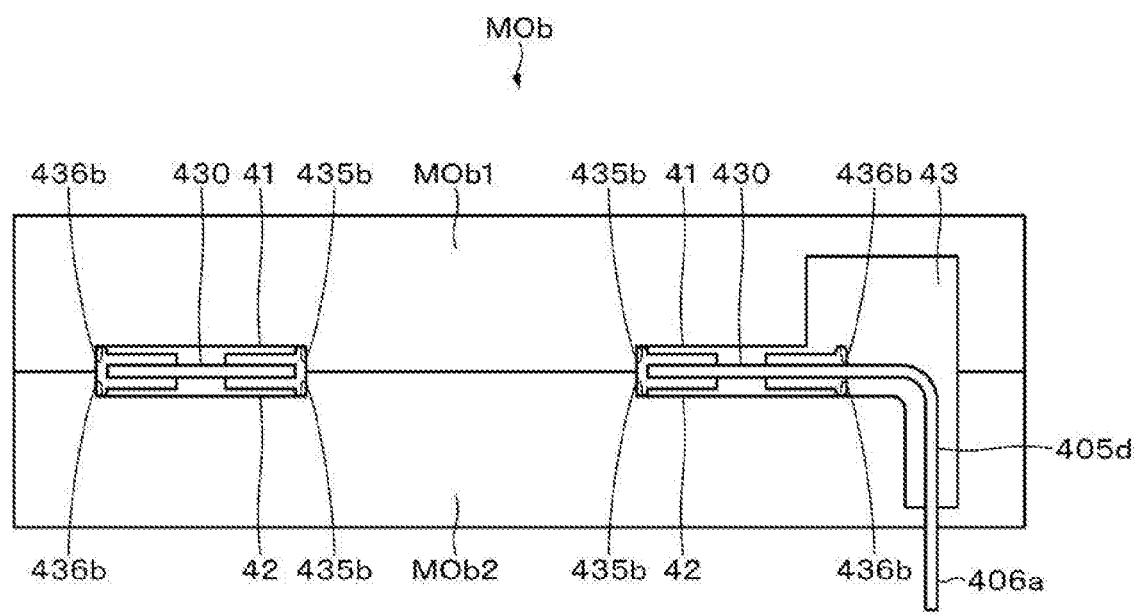
FIG. 16 is a view schematically illustrating the secondary-side coil housed in the mold in secondary molding.

After the inner frame is formed, the secondary molding is performed. In the secondary molding, the resin is molded on the part of the clamp portion 430, and the support portion 420b is simultaneously formed. As illustrated in FIG. 16, the secondary-side coil 40b having the inner frame formed therein is housed in the cavity of the mold MOb including the male MOb1 and the female MOb2. For example, a cylindrical member that the mold MOb includes is inserted into the opening portion 420. Under a state where the secondary-side coil 40b is housed in the cavity of the mold Mob, the rib 435b and the rib 436b, which are formed through the primary molding, are in abutment against an inner wall 41 on the male MOb1 side and an inner wall 42 in the female MOb2, respectively. Note that, in this example, space 43 for formation of the support portion 420b is provided in the cavity in the mold MOb, and hence, the rib 436b is partly not abutment against the inner wall 41.

Subsequently, the resin is injected into the cavity of the mold MOb. With this, the part at least including the clamp portion 430 that is the part where the metal is exposed on the base 405 is molded with the resin. Further, the resin is also injected into the space 43, so that the support portion 420b is formed.

Figure 17:
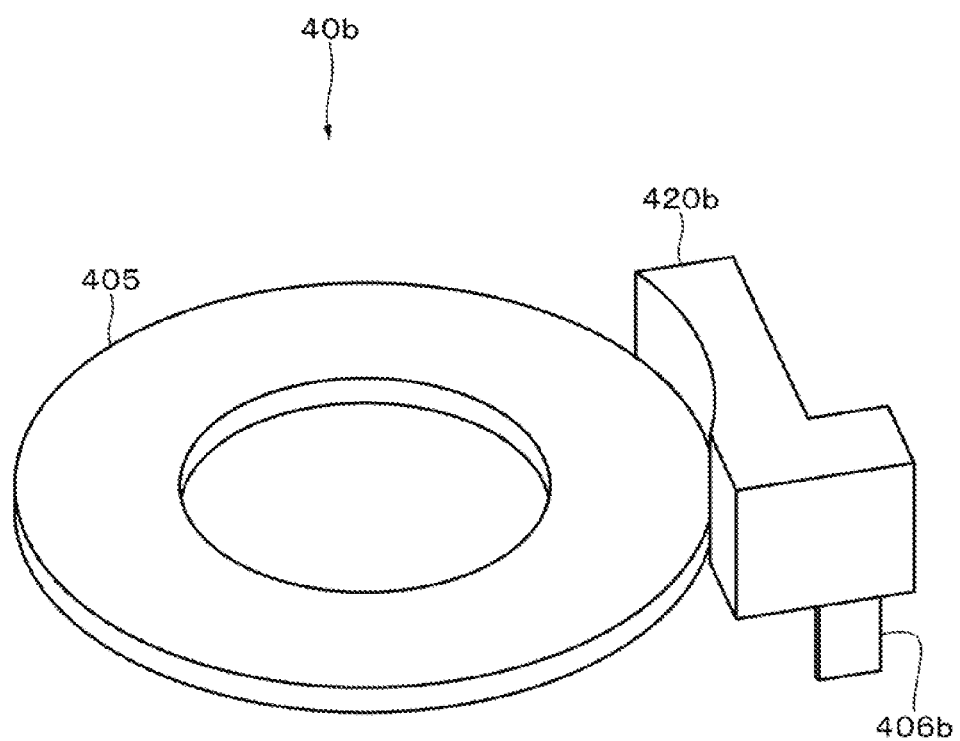
FIG. 17 is a perspective view illustrating an example of the secondary-side coil after the secondary molding.

FIG. 17 is a perspective view illustrating the secondary-side coil 40b after the secondary molding. Through the secondary molding, the base 405 is entirely molded with the resin and the support portion 420b is simultaneously formed. Further, only the terminal portions 406a and 406b are exposed.

Figure 18A:
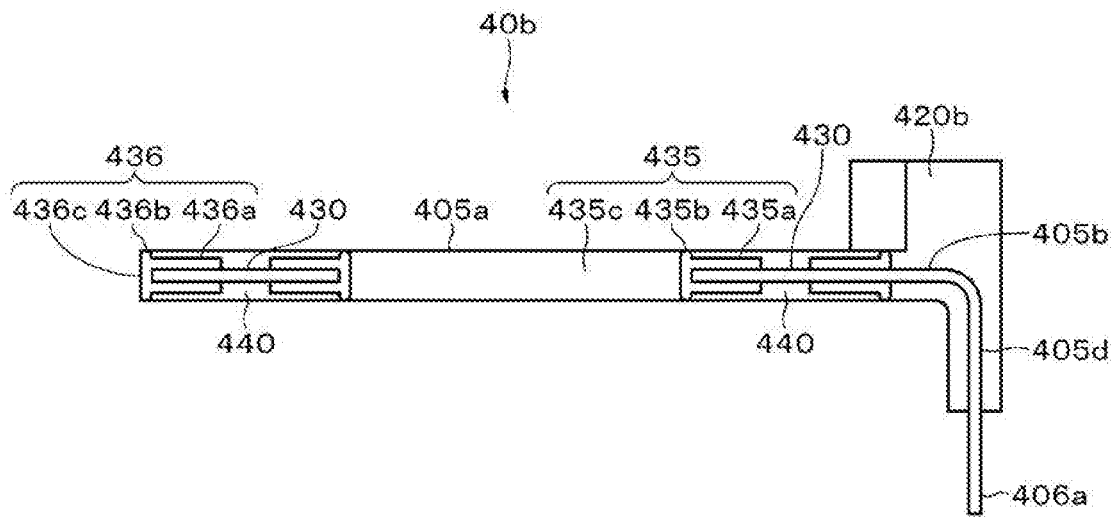
FIG. 18A is a view illustrating a cross section of the secondary-side coil after the secondary molding.

FIG. 18A is a view illustrating a cross section of the secondary-side coil 40b. Through the secondary molding, a resin portion 440 that is an example of a second resin portion is formed. With the resin portion 440, at least the clamp portion 430 held by the mold in the primary molding is molded. In the present embodiment, in addition to the clamp portion 430, the parts (for example, the extension portions 405b and 405c, and the leg portions 405d and 405e) not molded with the resin in the primary molding are molded with the resin portion 440. Further, with the resin portion 440, the support portion 420b is formed. Note that, the top portions of the ribs 435b and 436b, the resin layer 435c, and the resin layer 436c are exposed outside.

Figure 18B:
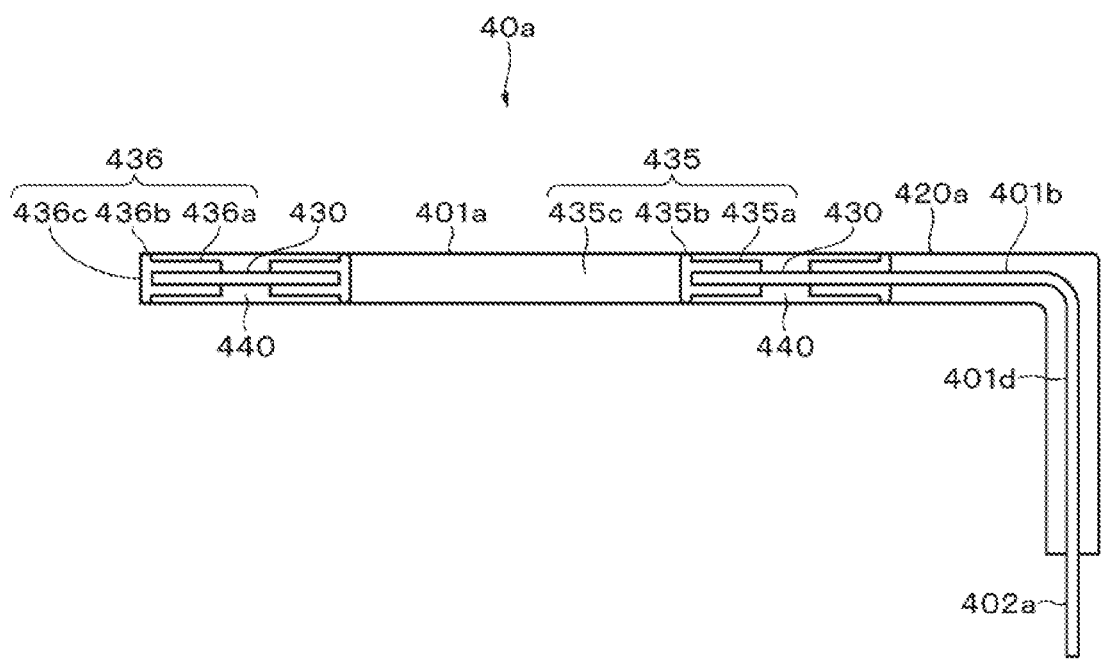
FIG. 18B is a view illustrating another cross section of the secondary-side coil after the secondary molding.

In the above, the description is made by taking the secondary-side coil 40b as an example, but the secondary-side coil 40a is molded with the resin in a similar manner. Now, the outline of a method of manufacturing the secondary-side coil 40a is described. FIG. 18B is a view illustrating a cross section of the secondary-side coil 40a after the secondary molding. Through the primary molding, the resin portions 435 and 436 are formed on the base portion 401a. Then, the secondary molding is performed under a state where the ribs 435b and 436b are in abutment against the inner wall of the mold, and the resin portion 440 is formed through the secondary molding. With the resin portion 440, the base 401 is molded. Note that, the plate-shaped portion 420a is formed in the secondary molding.

In the method of manufacturing a coil portion described above, at least the rib is formed in the primary molding under the state where the base (for example, base portion) of the secondary-side coil is directly and stably held. Thus, the rib can be formed while deformation of the secondary-side coil due to the pressure of resin injection is prevented. In addition, the secondary molding is performed under the state where the rib is in abutment against the inner wall of the mold. With this, the secondary-side coil is not deformed due to the pressure of resin injection, and a predetermined part (for example, clamp portion) of the secondary-side coil can thus be molded with the resin under a state where the position of the secondary-side coil is controlled with high accuracy.

2. Second Embodiment

Next, a second embodiment is described. Note that, unless otherwise noted, the matters described in the first embodiment are applicable to the second embodiment. Further, the same configurations as the configurations described in the first embodiment are denoted by the same reference symbols, and redundant description is appropriately simplified or omitted.

Figure 19:
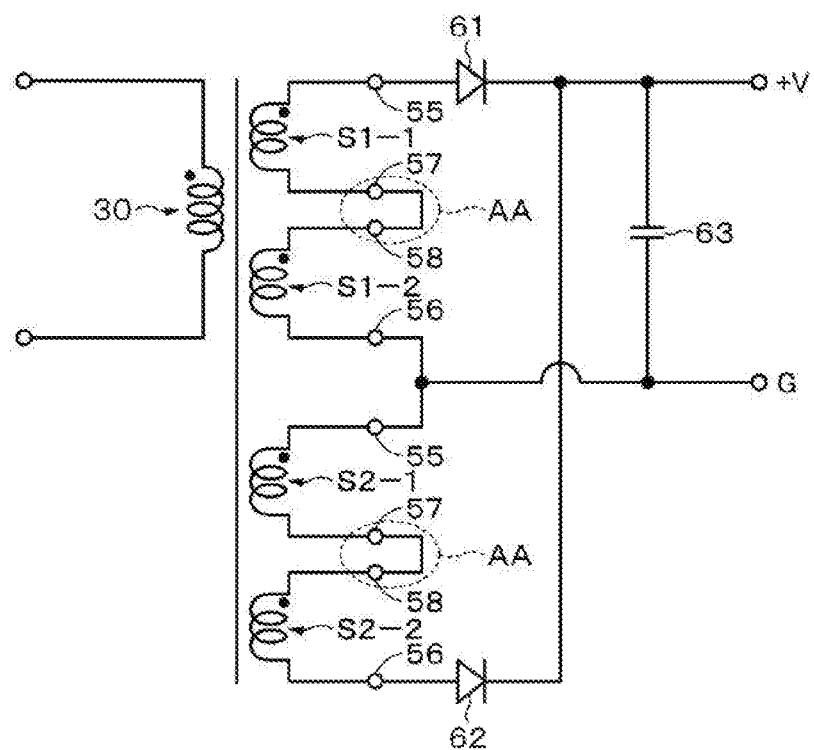
FIG. 19 is a wiring diagram illustrating a connection example of a transformer according to a second embodiment of the present disclosure.
Figure 20A:
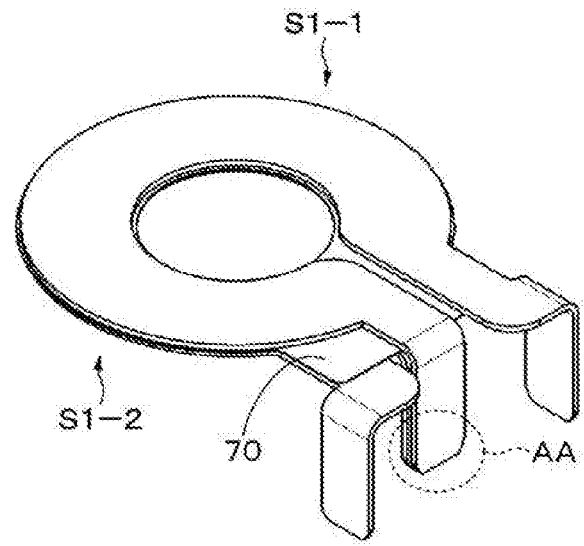
FIG. 20A and FIG. 20B are perspective views illustrating an appearance example of a secondary-side coil according to the second embodiment of the present disclosure.
Figure 20B:
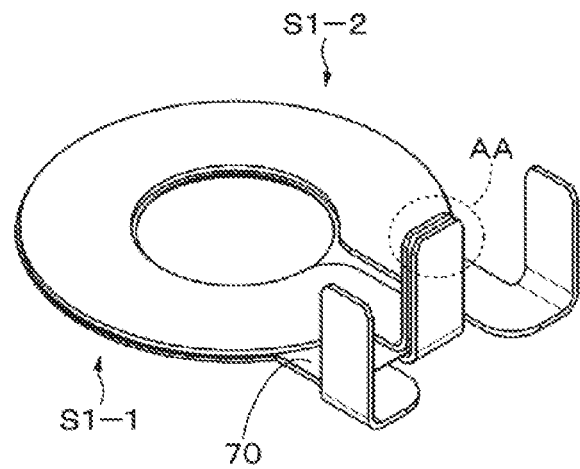

FIG. 19 is a wiring diagram of a transformer according to the second embodiment. The second embodiment is different from the first embodiment in that a secondary-side coil has a plurality of turns. Portions AA of FIG. 19 are a joint that connects a secondary-side S1-1 coil (one turn) and a secondary-side coil S1-2 (one turn) to each other, and a joint that connects a secondary-side coil S2-1 (one turn) coil and a secondary-side coil S2-2 (one turn) to each other. With this, a secondary-side coil having two turns (plurality of turns) is obtained. As illustrated in FIG. 20A and FIG. 20B, this connection can be made by, for example, the intermediate joint portions AA of the secondary-side S1-1 coil and the secondary-side coil S2-2 inserted into the circuit board to be connected by a substrate pattern, for example. To the secondary-side coils S1-1 and S1-2, the secondary-side coils 40a and 40b (for example, coils that include conductive metal plates such as tough pitch copper and are subjected to the front surface treatment for antioxidation, such as tinning) described in the first embodiment are applicable. The same holds true for the secondary-side coils S2-1 and S2-2. The primary-side coil 30 may include a single layer, two layers as in the first embodiment, or multiple (more than two) layers.

Here, if the two coils of the secondary-side coil S1-1 and the secondary-side coil S1-2 are in direct contact with each other, a short circuit occurs, and the secondary-side coil cannot have a plurality of turns. An insulating member 70 having high insulation, such as a polyester film, is accordingly inserted into or bonded to a part where the secondary-side coil S1-1 and the secondary-side coil S1-2 are direct contact with each other, so that the two coils are insulated from each other. Note that, a material of the insulating member 70 is not particularly limited as long as the material is capable of insulating the coils from each other. The insulating member 70 may be a member coated with an insulating material through insulation coating, for example.

Figure 21A:
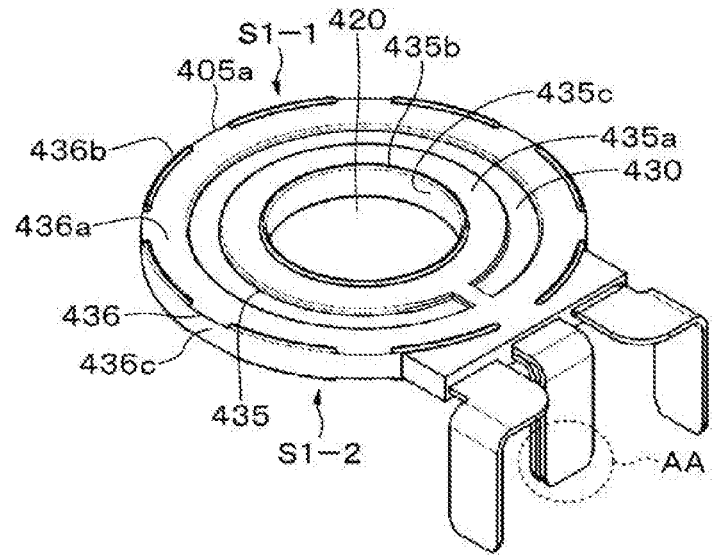
FIG. 21A and FIG. 21B are perspective views illustrating the secondary-side coil after the primary molding.
Figure 21B:
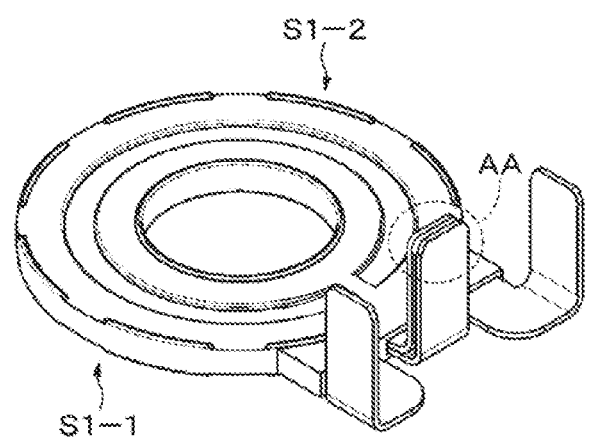

A manufacturing method similar to the one in the first embodiment is applied to the coil having two turns (plurality of turns) illustrated in FIG. 20A and FIG. 20B, so that an inner frame similar to the one in the first embodiment is molded as illustrated in FIG. 21A and FIG. 21B. After that, the secondary molding is performed, so that the number of turns on the secondary side can be two (plurality of turns).

Figure 22A:
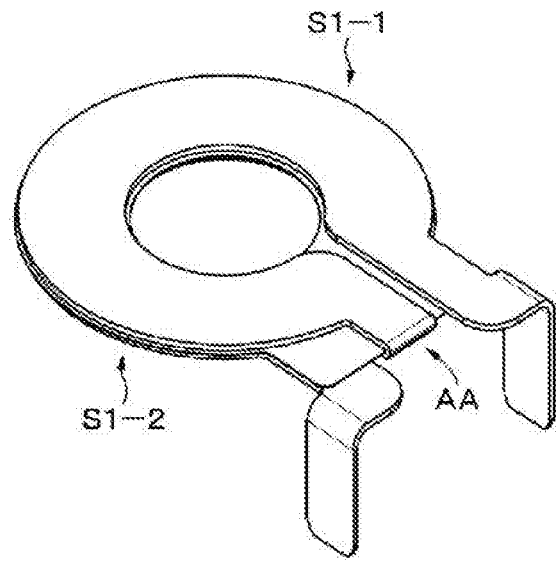
FIG. 22A and FIG. 22B are perspective views illustrating another appearance example of the secondary-side coil according to the second embodiment of the present disclosure.
Figure 22B:
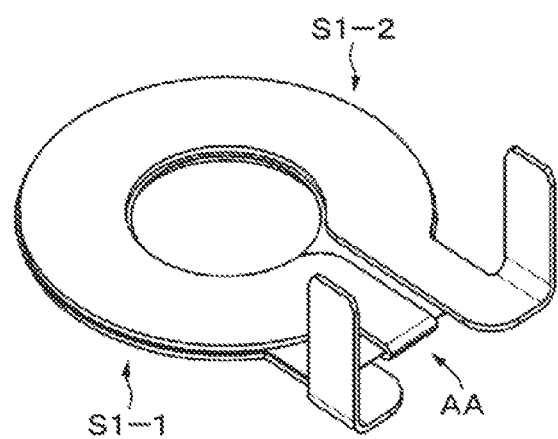
Figure 23A:
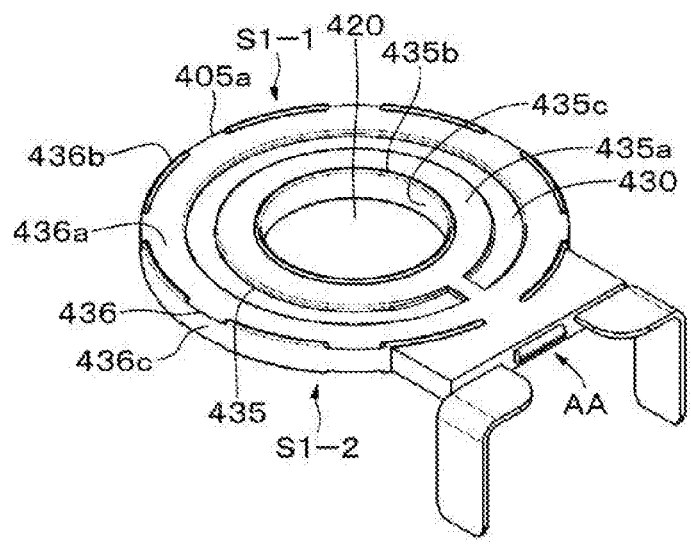
FIG. 23A and FIG. 23B are perspective views illustrating the secondary-side coil after the primary molding.
Figure 23B:
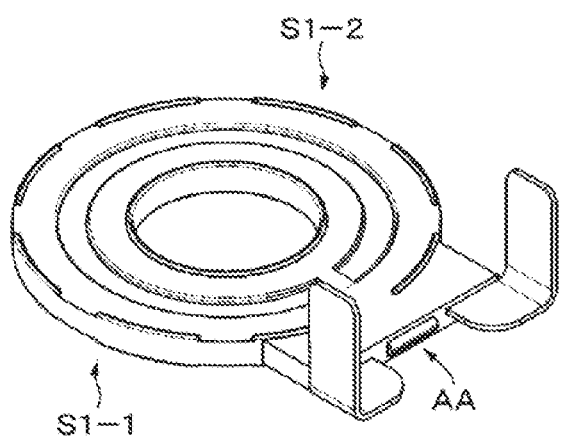

Note that, as illustrated in FIG. 22A and FIG. 22B, with the intermediate joint portion AA of the secondary-side coil manufactured to have a continuous shape subjected to bending processing, the secondary-side coil can also have a plurality of turns. Further, a manufacturing method similar to the one in the first embodiment is applied to the coil having two turns (plurality of turns) illustrated in FIG. 22A and FIG. 22B, so that an inner frame similar to the one in the first embodiment is molded as illustrated in FIG. 23A and FIG. 23B. After that, the secondary molding is performed, so that the number of turns on the secondary side can be two (plurality of turns) (note that, to avoid complicated figures, reference symbols of the inner frames in FIG. 21B and FIG. 23B are omitted).

According to the second embodiment, in addition to the effects provided by the first embodiment, the following effects can be obtained, for example. With the secondary-side coil having a plurality of turns (for example, two turns), the following are achieved.

The number of turns of the primary-side coil can be increased by turn ratio times, and hence adjustment of the primary-side inductance and other electrical properties can be facilitated.

Miniaturization of the ferrite core can be achieved.

The following two transformers are compared to each other, for example:

a transformer having a turn ratio of 8 (primary):1 (secondary), an inductance of 400 pH, a current of 3 A, and a core effective cross-sectional area of 250 mm$^2$ (transformer of (1)); and a transformer including a secondary-side coil with two turns, and having the same properties as the above-mentioned transformer except for a turn ratio that is 16 (primary):2 (secondary) (transformer of (2)).

Here, saturation magnetic flux densities are each derived from "B (saturation magnetic flux density)=L (inductance)*I (current)/Ae (core effective cross-sectional area)*primary number of turns," and the derived values are as follows.

(1) Turn ratio: 8 (primary):1 (secondary) . . . 600 mT
(2) Turn ratio: 16 (primary):2 (secondary) . . . 300 mT The maximum saturation magnetic flux density of a generally used material of a ferrite core is approximately 400 mT at 100° C., and hence it is found that the transformer of (1) cannot be function as a transformer. In order to avoid this, it is necessary to increase a core effective cross-sectional area or increase the number of turns. Increasing the core effective cross-sectional area is, however, a factor that prevents miniaturization. Thus, with the secondary-side coil having a plurality of turns, miniaturization of the core can be achieved, and miniaturization of the transformer can therefore be achieved.

3. Modified Example

The plurality of embodiments of the present disclosure are specifically described above, but the contents of the present disclosure are not limited to the above-mentioned embodiments. Various modifications based on the technical ideas of the present disclosure can be made.

Figure 24:
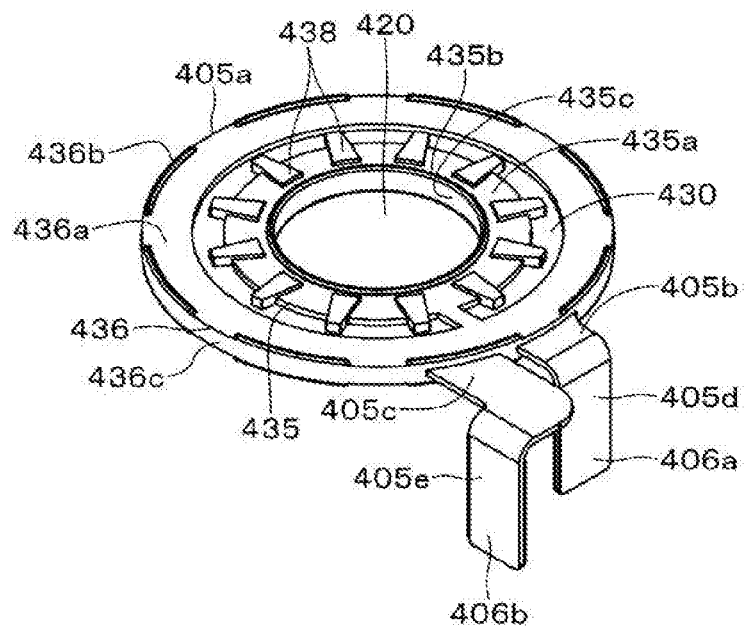
FIG. 24 is a view illustrating a modified example.
Figure 25:
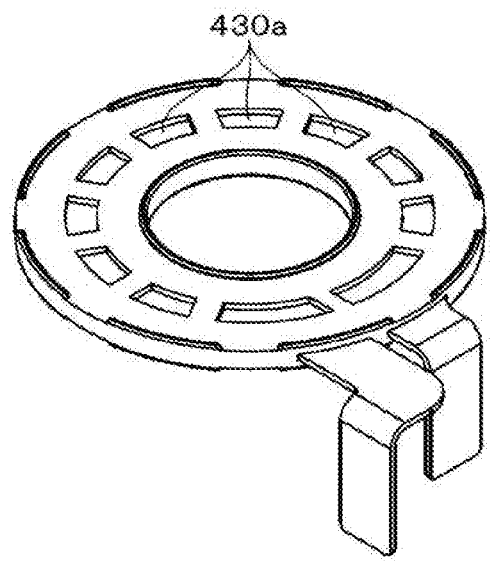
FIG. 25 is a view illustrating a modified example.

In the first and second embodiments, the shape of the inner frame, which is formed through the primary molding, can be appropriately changed. For example, as illustrated in FIG. 24, the inner frame may include a plurality of ribs 438 formed radially from the resin portion 435 to the clamp portion 430. Further, the part at which the clamp portion 430 is set can also be appropriately changed depending on the mold. For example, as illustrated in FIG. 25, clamp portions 430a separately arranged to form a ring may be employed.

Figures 26, 27:
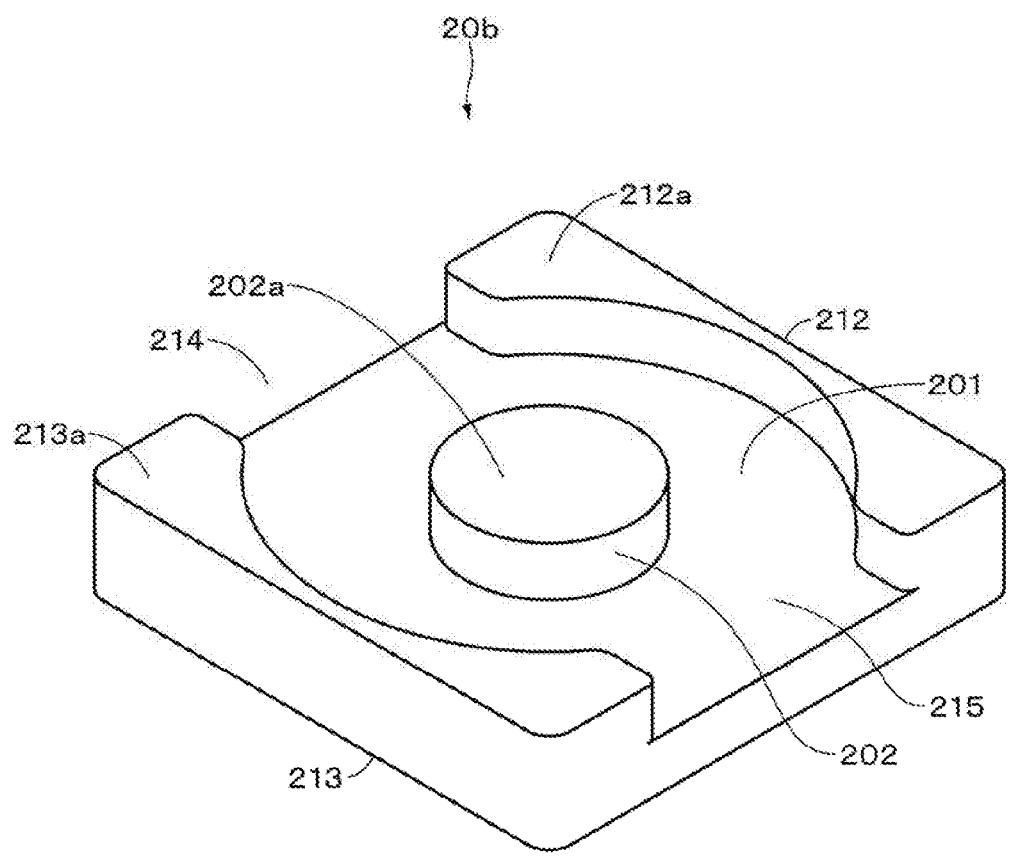
FIG. 26 is a view illustrating a modified example.
FIG. 27 is a diagram illustrating a modified example.

As illustrated in FIG. 26, in order to improve the reliability of insulation, parts other than an upper surface 212a of the peripheral wall 212, an upper surface 213A of the peripheral wall 213, and an upper surface 202a of the protrusion portion 202, in other words, parts other than the abutment portion of the core 20b, which affects the performance of the transformer 1, may be subjected to treatment for ensuring insulation. For example, insulation coating or powder coating may be performed on the part in question to ensure the insulation or an insulation tape or a protective tape may be bonded thereto to ensure the insulation.

The arrangement of the primary-side coil and the secondary-side coil can be appropriately changed. For example, as illustrated in FIG. 27, the primary-side coils 30 and the secondary-side coils 40 may be alternately arranged between the cores 20. With this configuration, the intrinsic deflection can be reduced, so that the transformer 1 can be configured as a converter transformer through which large current flows.

In the embodiments described above, the primary-side coil 30 may be molded with the resin. Further, the primary-side coil 30 may be manufactured by a manufacturing method similar to the one in the embodiment.

The shapes of the secondary-side coils 40a and 40b in the embodiments described above can be appropriately changed. For example, the shape of the base portion may be a polygonal shape such as a rectangular shape instead of the C shape, and the extension portion may not be provided. Further, the secondary-side coil is not limited to the configuration including the two secondary-side coils, and may include multilayers (for example, four layers) to support a larger output. Further, the base and the terminal portion of the secondary-side coil may be formed discontinuously, and each portion may be soldered, for example.

In the embodiments described above, the assembly member may be formed in a separate process. Different kinds of resins may be used between the primary molding and the secondary molding.

The configurations, methods, processes, shapes, materials, numerical values, and the like given in the embodiments described above are only examples, and configurations, methods, processes, shapes, materials, numerical values, and the like different from those in the embodiments may be included as needed. Further, the matters described in the embodiments and the modified example can be combined with each other as long as technical contradictions do not occur.

Note that, the present disclosure can also take the following configurations.

(1)
An electronic component, including:
a coil portion including
a base including a conductive metal, and
a terminal portion that is connected to a predetermined circuit board,
in which a front surface of the base is covered and the terminal portion is exposed.
(2)
The electronic component according to Item (1), in which the front surface of the base is covered with a resin portion.
(3)
The electronic component according to Item (2), in which the resin portion includes a first resin portion including a protrusion portion, and a second resin portion with which at least a predetermined part of the base is molded.
(4)
The electronic component according to Item (3), in which the predetermined part is a part that is held by a holding member when the first resin portion is formed.
(5)
The electronic component according to any one of Items (2) to (4), in which the resin portion includes a thermosetting resin or a thermoplastic resin.
(6)
The electronic component according to any one of Items (1) to (5), in which the base and the terminal portion are continuously formed.
(7)
The electronic component according to any one of Items (1) to (6), in which the coil portion is a secondary-side coil.
(8)
The electronic component according to Item (7),
in which the secondary-side coil includes a plurality of secondary-side coils, and
in which a primary-side coil is disposed between the plurality of secondary-side coils.
(9)
The electronic component according to Item (8), in which the primary-side coil includes winding subjected to insulation coating.
(10)
The electronic component according to any one of Items (1) to (9), further including:
a core.
(11)
A power supply device, including:
the electronic component according to any one of Items (1) to (10).
(12)
A method of manufacturing a coil, including:
while holding, by a holding member, a predetermined part of a base including a conductive metal plate, forming at least a protrusion portion with resin on a part of the base that is different from the predetermined part held; and
molding, after the protrusion portion is formed, at least the predetermined part with the resin while causing the protrusion portion to be in abutment against a mold.
(13)
The method of manufacturing a coil according to Item (12), in which the protrusion portion is formed on each surface of the base.
(14)
The method of manufacturing a coil according to Item (12) or (13), in which the base is molded with the resin, and an assembly member is simultaneously formed with the resin.

4. Application Example

The technology according to the present disclosure is applicable to various products. For example, the present disclosure can also be realized as a power supply device including, for example, a power supply portion connected to a power supply unit using the transformer according to one of the embodiments described above. In addition, such a power supply device may be realized as a device that is mounted on any type of moving bodies including, for example, automobiles, electric cars, hybrid electric cars, motorcycles, bicycles, personal mobilities, airplanes, drones, ships, robots, construction machinery, and agricultural machinery (tractors). Now, specific application examples are described, but the contents of the present disclosure are not limited to the application examples described below.

Power Storage System in Vehicle as Application Example

Figure 28:
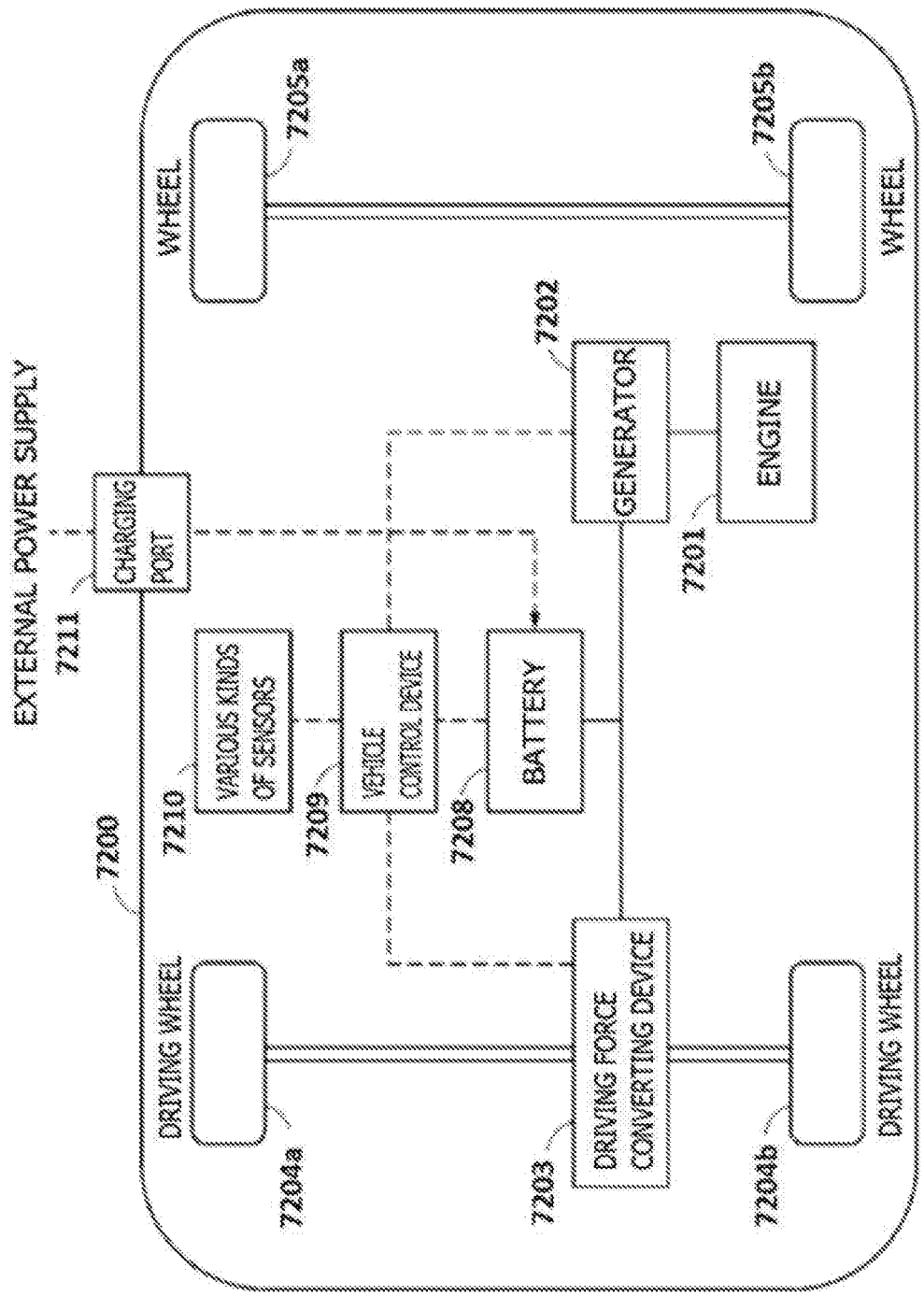
FIG. 28 is a diagram illustrating an application example.

An example in which the present disclosure is applied to a power storage system for a vehicle is described with reference to FIG. 28. FIG. 28 schematically illustrates a configuration example of a hybrid vehicle employing a series hybrid system to which the present disclosure is applied. The series hybrid system is an automobile that runs by a power to driving force converting device with the use of electric power generated by a generator that is driven by an engine or the electric power once stored in a battery.

This hybrid vehicle 7200 includes an engine 7201, a generator 7202, a power to driving force converting device 7203, a driving wheel 7204a, a driving wheel 7204b, a wheel 7205*a*, a wheel 7205*b*, a battery 7208, a vehicle control device 7209, various kinds of sensors 7210, and a charging port 7211. The above-described transformer according to the embodiment of the present disclosure is applied to a control circuit of the battery 7208 and a circuit of the vehicle control device 7209.

The hybrid vehicle 7200 runs with the power to driving force converting device 7203 as a power source. An example of the power to driving force converting device 7203 is a motor. The power to driving force converting device 7203 is activated by the power of the battery 7208. A rotational force of the power to driving force converting device 7203 is transmitted to the driving wheels 7204*a* and 7204*b*. Incidentally, the power to driving force converting device 7203 is applicable both as an alternating-current motor and as a direct-current motor by using direct current to alternating current conversion (DC-to-AC conversion) or reverse conversion (AC-to-DC conversion) at a necessary position. The various kinds of sensors 7210 control engine speed via the vehicle control device 7209, and control a degree of opening (degree of throttle opening) of a throttle valve not depicted in the figure. The various kinds of sensors 7210 include a speed sensor, an acceleration sensor, an engine speed sensor, and the like.

A rotational force of the engine 7201 is transmitted to the generator 7202. Power generated by the generator 7202 by the rotational force can be stored in the battery 7208.

When the hybrid vehicle is decelerated by a braking mechanism not depicted in the figure, a resistance force at the time of the deceleration is applied as a rotational force to the power to driving force converting device 7203. Regenerative power generated by the power to driving force converting device 7203 by the rotational force is stored in the battery 7208.

The battery 7208 can also be connected to a power supply external to the hybrid vehicle to be supplied with power from the external power supply with the charging port 7211 as an input port, and store the received power.

Though not depicted, an information processing device may be provided which performs information processing related to vehicle control on the basis of information about the secondary battery. As such an information processing device, there is, for example, an information processing device that makes battery remaining charge amount display on the basis of information about an amount of charge remaining in the battery.

The above description has been made by taking, as an example, a series hybrid vehicle run by a motor using power generated by a generator driven by an engine or power supplied from a battery that stores the power generated by the generator. However, the present disclosure is effectively applicable also to a parallel hybrid vehicle that uses both of outputs of an engine and a motor as driving sources and which appropriately selects and uses three systems, that is, a system in which the vehicle is run by only the engine, a system in which the vehicle is run by only the motor, and a system in which the vehicle is run by the engine and the motor. Further, the present disclosure is effectively applicable also to an electric vehicle run by being driven by only a driving motor without the use of an engine.

The example of the hybrid vehicle 7200 to which the technology according to the present disclosure is applicable is described above.

Power Storage System in House as Application Example

Figure 29:
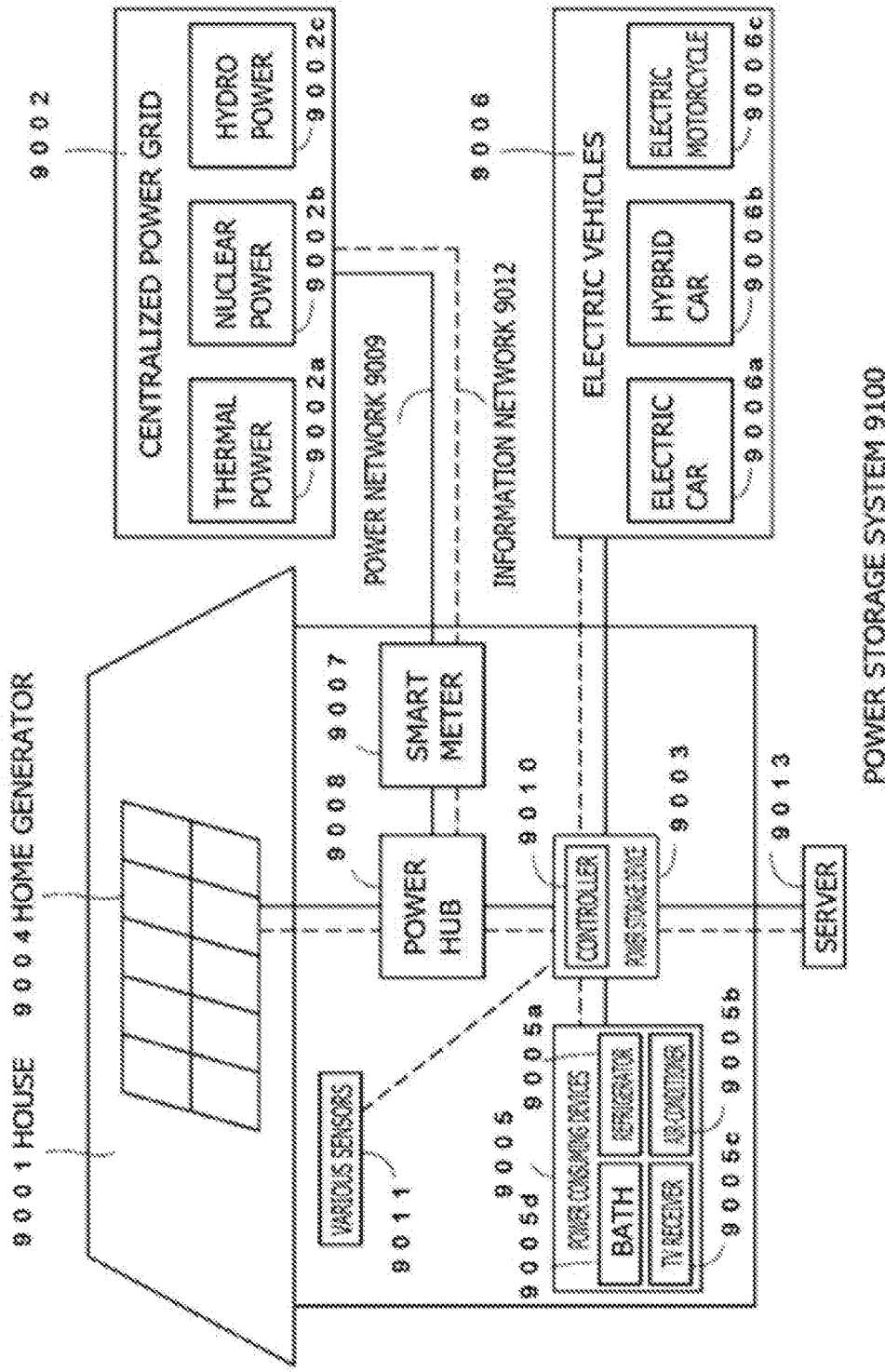
FIG. 29 is a diagram illustrating an application example.

An example in which the present disclosure is applied to a power storage system for a house is described with reference to FIG. 29. For example, in a power storage system 9100 for a house 9001, electric power is supplied to a power storage device 9003 from a centralized power grid 9002 such as thermal power generation 9002*a*, nuclear power generation 9002*b*, or hydro power generation 9002*c* via a power network 9009, an information network 9012, a smart meter 9007, a power hub 9008, and the like. Along with this, electric power is supplied to the power storage device 9003 from an independent power supply such as a home generator 9004. The electric power supplied to the power storage device 9003 is stored. With the use of the power storage device 9003, the electric power to be used in the house 9001 is supplied. A similar power storage system can also be used in a building in addition to the house 9001.

The house 9001 is equipped with the generator 9004, power consuming devices 9005, the power storage device 9003, a controller 9010 for controlling these various devices, the smart meter 9007, and sensors 9011 for acquiring various information. These devices are connected by the power network 9009 and the information network 9012. A solar or fuel cell, for example, is used as the generator 9004. Generated electric power is supplied to the power consuming devices 9005 and/or the power storage device 9003. The power consuming devices 9005 are a refrigerator 9005*a*, an air-conditioner 9005*b*, a television (TV) receiver 9005*c*, a bath 9005*d*, and so on. The power consuming devices 9005 further include electric vehicles 9006. The electric vehicles 9006 are an electric car 9006*a*, a hybrid car 9006*b*, and an electric motorcycle 9006*c*.

The transformer according to the embodiment of the present disclosure described above is used for a peripheral circuit of the power storage device 9003. The power storage device 9003 includes a secondary battery or capacitor. For example, the power storage device 9003 includes a lithium ion battery. The lithium ion battery may be a stationary one or one designed for the electric vehicles 9006. The smart meter 9007 is capable of measuring commercial power consumption and sending the measured consumption to an electric power company. The power network 9009 may include any one or a plurality of direct current (DC), alternating current (AC), and non-contact power supplies.

The various sensors 9011 are, for example, human, illuminance, object detection, power consumption, vibration, contact, temperature, infrared, and other sensors. Information acquired by the various sensors 9011 is sent to the controller 9010. Information from the sensors 9011 makes it possible to find out about meteorological, human, and other conditions, so as to automatically control the power consuming devices 9005 and reduce energy consumption to minimum. Further, the controller 9010 can send information on the house 9001, for example, to an external electric power company via the Internet.

The power hub 9008 handles the division of a power line into branches, DC/AC conversion, and other tasks. Communication schemes used between the controller 9010 and the information network 9012 connected thereto are the one using communication interfaces such as universal asynchronous receiver-transmitter (UART) and the one using sensor networks based on wireless communication standards such as Bluetooth, ZigBee, and wireless fidelity (Wi-Fi). Bluetooth scheme is applied to multimedia communication to permit one-to-many communication. ZigBee uses the physical layer of institute of electrical and electronic engineers (IEEE) 802.15.4. IEEE 802.15.4 is the name of a short-distance wireless network standard that is referred to as personal area network (PAN) or wireless (W) PAN.

The controller 9010 is connected to an external server 9013. The external server 9013 may be managed by any of the house 9001, an electric power company, or a service provider. Information sent and received by the server 9013 is, for example, power consumption information, life pattern information, power rate information, weather information, natural disaster information, and information on electricity trading. These pieces of information may be sent to and received from a power consuming device (e.g., TV receiver) in the home. Alternatively, they may be sent to and received from a device outside of the home (e.g., mobile phone). These pieces of information may be shown on an appliance with a display function such as TV receiver, mobile phone, or personal digital assistant (PDA).

The controller 9010 that controls each of these sections includes, for example, a central processing unit (CPU), a random access memory (RAM), and a read only memory (ROM). In the present example, the controller 9010 is accommodated in the power storage device 9003. The controller 9010 is connected to the power storage device 9003, the home generator 9004, the power consuming devices 9005, the various sensors 9011, and the server 9013 via the information network 9012. The controller 9010 is capable, for example, of regulating commercial power consumption and power output. It should be noted that the controller 9010 may additionally be capable of trading electricity in electricity markets.

As described above, not only electric power from the centralized power grid 9002 including the thermal power 9002*a*, the nuclear power 9002*b*, the hydro power 9002*c* and the like but also that generated by the home generator 9004 (solar and wind power) can be stored in the power storage device 9003. Therefore, it is possible to perform control including, for example, maintaining the externally supplied power constant or discharging the power storage device 9003 as much as possible needed even in the event of a change in power generated by the home generator 9004. For example, it is possible to store electric power obtained from solar power generation and inexpensive midnight power with low night rates in the power storage device 9003, and discharge and use the power stored in the power storage device 9003 in daytime hours with high rates.

It should be noted that although a case has been described in the present example in which the controller 9010 is accommodated in the power storage device 9003, the controller 9010 may be accommodated in the smart meter 9007. Alternatively, the controller 9010 may be a standalone unit. Still alternatively, the power storage system 9100 may be used for a plurality of households in a housing complex. Still alternatively, the power storage system 9100 may be used for a plurality of detached houses.

The example of the power storage system 9100 to which the technology according to the present disclosure is applicable is described above. The technology according to the present disclosure is suitably applicable to the power storage device 9003 among the configurations described above. Specifically, the electronic component according to one of the embodiments is applicable to a circuit related to the power storage device 9003.

REFERENCE SIGNS LIST

10 . . . Transformer
20, 20*a*, 20*b* . . . Core
30, 30*a*, 30*b* . . . Primary-side coil
40, 40*a*, 40*b* . . . Secondary-side coil
401, 405 . . . Base
402*a*, 402*b*, 406*a*, 406*b* . . . Terminal portion
420*a* . . . Plate-shaped portion
420*b* . . . Support portion
430 . . . Clamp portion
435, 436 . . . Resin portion
435*b*, 436*b* . . . Rib
440 . . . Resin portion

The invention claimed is:

1. An electronic component, comprising:
a first coil portion; and
a second coil portion that includes:
 a first secondary-side coil and a second secondary-side coil, wherein
  the first secondary-side coil includes a first base, a first terminal portion, a second terminal portion, and a first assembly member,
  the first base includes a conductive metal plate,
  a longitudinal surface of the first terminal portion is perpendicular to a corresponding longitudinal surface of the second terminal portion,
  the second secondary-side coil includes a second base and a second assembly member,
  a portion of the first base and a portion of the second base are covered with a resin,
  the second assembly member is configured to engage with the first assembly member,
  the first terminal portion of the first secondary-side coil is connected to a determined circuit board, and
  the first terminal portion is exposed.

2. The electronic component according to claim 1, wherein the resin includes:
a first resin portion that includes a protrusion portion, and
a second resin portion in which a determined part of the first base and the second base is molded.

3. The electronic component according to claim 2, wherein
the determined part is a part of one of the first base or the second base that is held by a holding member when the first resin portion is formed.

4. The electronic component according to claim 1, wherein the resin includes a thermosetting resin or a thermoplastic resin.

5. The electronic component according to claim 1, wherein the first base and the first terminal portion are continuously formed.

6. The electronic component according to claim 1, wherein
the first coil portion includes a primary-side coil.

7. The electronic component according to claim 6, wherein
the primary-side coil is between the first secondary-side coil and the second secondary-side coil.

8. The electronic component according to claim 7, wherein the primary-side coil includes winding that is coated with an insulation material.

9. The electronic component according to claim 1, further comprising a core.

10. The electronic component according to claim 1, wherein
the first assembly member and the second assembly member are covered with the resin.

11. A power supply device, comprising:
an electronic component that comprises:
 a first coil portion; and
 a second coil portion that includes:
  a first secondary-side coil and a second secondary-side coil, wherein the first secondary-side coil includes a first base, a first terminal portion, a second terminal portion, and a first assembly member,
the first base includes a conductive metal plate,
a longitudinal surface of the first terminal portion is perpendicular to a corresponding longitudinal surface of the second terminal portion,
the second secondary-side coil includes a second base and a second assembly member,
a portion of the first base and a portion of the second base are covered with a resin,
the second assembly member is configured to engage with the first assembly member,
the first terminal portion of the first secondary-side coil is connected to a determined circuit board, and
the first terminal portion is exposed.

\* \* \* \* \*